United States Patent
Tcherniaev et al.

(10) Patent No.: US 6,577,992 B1
(45) Date of Patent: Jun. 10, 2003

(54) TRANSISTOR LEVEL CIRCUIT SIMULATOR USING HIERARCHICAL DATA

(75) Inventors: Andrei Tcherniaev, Mountain View, CA (US); Iouri Feinberg, Saratoga, CA (US); Walter Chan, Milpitas, CA (US); Jeh-Fu Tuan, Saratoga, CA (US); An-Chang Deng, Saratoga, CA (US)

(73) Assignee: Nassda Corporation, Santa Clara, CA (US)

( * ) Notice: Subject to any disclaimer, the term of this patent is extended or adjusted under 35 U.S.C. 154(b) by 0 days.

(21) Appl. No.: 09/307,169

(22) Filed: May 7, 1999

(51) Int. Cl.[7] .............................................. G06F 17/50
(52) U.S. Cl. .......................... 703/14; 703/15; 703/16; 716/7; 716/8; 716/12; 716/20
(58) Field of Search ................... 703/14, 15; 716/12, 716/7, 8, 20

(56) References Cited

U.S. PATENT DOCUMENTS

| | | | |
|---|---|---|---|
| 4,651,284 A | 3/1987 | Watanabe et al. ............ 364/491 |
| 4,656,592 A | 4/1987 | Spaanenburg et al. ...... 364/490 |
| 4,835,704 A | 5/1989 | Eichelberger et al. ....... 364/490 |
| 4,878,179 A | 10/1989 | Larsen et al. ................. 364/490 |
| 4,939,681 A | 7/1990 | Yokomizo et al. ........... 364/578 |
| 4,965,758 A | 10/1990 | Sherman ...................... 365/578 |
| 5,051,938 A | 9/1991 | Hyduke ........................ 364/578 |
| 5,062,054 A | 10/1991 | Kawakami et al. .......... 364/491 |
| 5,067,091 A | 11/1991 | Nakazawa ................... 364/490 |
| 5,081,602 A | 1/1992 | Glover ......................... 364/578 |
| 5,084,824 A | 1/1992 | Lam et al. .................... 364/490 |
| 5,202,841 A | 4/1993 | Tani ............................. 364/491 |
| 5,247,456 A | 9/1993 | Ohe et al. .................... 364/491 |
| 5,247,468 A | 9/1993 | Henrichs et al. ............. 364/578 |
| 5,249,133 A | 9/1993 | Batra ........................... 364/489 |
| 5,301,318 A | 4/1994 | Mittal .......................... 395/600 |
| 5,331,568 A | 7/1994 | Pixley .......................... 364/489 |
| 5,345,401 A | 9/1994 | Tani ............................. 364/578 |
| 5,349,542 A | 9/1994 | Brasen et al. ................ 364/578 |
| 5,384,710 A | 1/1995 | Lam et al. .................... 364/489 |

(List continued on next page.)

OTHER PUBLICATIONS

"The Quadtree and Related Hierarchical Data Structures", Hanan Samet, 1984 ACM 0360–0300/84/0600–0187.*

G. Kron, "A Set of Principles to Interconnect the Solutions of Physical Systems", Aug., 1953, Journal of Applied Physics, vol. 24, No. 8, pp. 965–980.

(List continued on next page.)

*Primary Examiner*—Hugh Jones
*Assistant Examiner*—Fred Ferris
(74) *Attorney, Agent, or Firm*—Fish & Richardson P.C.

(57) ABSTRACT

Methods and apparatus for generating a hierarchical representation of a circuit include obtaining a netlist corresponding to the circuit, the circuit including a plurality of subcircuits. A hierarchical representation of the circuit is then generated from the netlist, the hierarchical representation including the plurality of subcircuits arranged among a plurality of levels of the hierarchical representation. Each one of the plurality of subcircuits has an associated subcircuit definition. In addition, each of a plurality of subsets of the subcircuits share a same subcircuit definition, where memory storage for the same subcircuit definition is shared by the subcircuits in each of the subsets. Moreover, each one of the plurality of subcircuits has a dynamic voltage state. Selected ones of the subcircuits in each of the plurality of subsets share a same dynamic voltage state, where memory storage for the same dynamic voltage state is shared by the subcircuits in each of the selected ones of the plurality of subsets. Once generated, the hierarchical representation may be used during simulation of the circuit to reduce the number of computations required.

50 Claims, 18 Drawing Sheets

U.S. PATENT DOCUMENTS

| | | | |
|---|---|---|---|
| 5,404,310 A | 4/1995 | Mitsuhashi | 364/490 |
| 5,416,717 A | 5/1995 | Miyama et al. | 364/488 |
| 5,440,162 A | 8/1995 | Worley et al. | 257/355 |
| 5,446,676 A | 8/1995 | Huang et al. | 364/578 |
| 5,455,929 A | 10/1995 | Bosshart et al. | 395/500 |
| 5,461,573 A | 10/1995 | Chakradhar et al. | 364/489 |
| 5,463,561 A | 10/1995 | Razdan | 364/489 |
| 5,477,474 A | 12/1995 | Southgate et al. | 364/578 |
| 5,481,469 A | 1/1996 | Brasen et al. | 364/483 |
| 5,481,473 A | 1/1996 | Kim et al. | 364/490 |
| 5,490,095 A | 2/1996 | Shimada et al. | 364/578 |
| 5,493,508 A | 2/1996 | Dangelo et al. | 364/489 |
| 5,521,834 A | 5/1996 | Crafts et al. | 364/489 |
| 5,526,277 A | 6/1996 | Dangelo et al. | 364/489 |
| 5,528,508 A | 6/1996 | Russell et al. | 364/488 |
| 5,541,849 A | 7/1996 | Rostoker et al. | 364/489 |
| 5,544,066 A | 8/1996 | Rostoker et al. | 364/489 |
| 5,544,067 A | 8/1996 | Rostoker et al. | 364/489 |
| 5,548,524 A | 8/1996 | Hernandez et al. | 364/489 |
| 5,550,749 A | 8/1996 | Dey et al. | 364/489 |
| 5,553,002 A | 9/1996 | Dangelo et al. | 364/489 |
| 5,553,008 A | 9/1996 | Huang et al. | 364/578 |
| 5,574,893 A | 11/1996 | Southgate et al. | 395/500 |
| 5,585,765 A | 12/1996 | O'Shaughnessy | 331/111 |
| 5,592,118 A | 1/1997 | Wilmot et al. | 327/440 |
| 5,598,348 A | 1/1997 | Rusu et al. | 364/491 |
| 5,623,418 A | 4/1997 | Rostoker et al. | 364/489 |
| 5,625,564 A | 4/1997 | Rogoyski | 364/489 |
| 5,629,858 A | 5/1997 | Kundu et al. | 364/488 |
| 5,671,399 A | 9/1997 | Meier | 395/500 |
| 5,684,723 A | 11/1997 | Nakadai | 364/578 |
| 5,748,486 A | 5/1998 | Ashar et al. | 364/488 |
| 5,754,826 A | 5/1998 | Gamal et al. | 395/500 |
| 5,761,664 A * | 6/1998 | Sayah et al. | 707/100 |
| 5,764,951 A * | 6/1998 | Ly et al. | 395/500 |
| 5,794,008 A | 8/1998 | Meyers et al. | 395/500 |
| 5,801,958 A | 9/1998 | Dangelo et al. | 364/489 |
| 5,805,860 A * | 9/1998 | Parham | 716/12 |
| 5,812,431 A | 9/1998 | Kundert | 364/578 |
| 5,831,869 A | 11/1998 | Ellis et al. | 364/490 |
| 5,835,380 A | 11/1998 | Roethig | 364/488 |
| 5,859,785 A | 1/1999 | Kundert | 364/578 |
| 5,867,397 A * | 2/1999 | Koza et al. | 364/489 |
| 5,872,952 A | 2/1999 | Tuan et al. | 395/500 |
| 5,878,053 A | 3/1999 | Koh et al. | 371/22.1 |
| 5,909,376 A * | 6/1999 | Scepanovic et al. | 716/8 |
| 5,933,358 A | 8/1999 | Koh et al. | 364/578 |
| 5,991,521 A * | 11/1999 | Gabele et al. | 324/512 |
| 6,031,979 A * | 2/2000 | Hachiva | 716/2 |
| 6,112,022 A * | 8/2000 | Wei | 703/14 |
| 6,134,513 A * | 10/2000 | Gopal | 703/14 |
| 6,134,702 A * | 10/2000 | Scepanovic et al. | 716/10 |
| 6,295,627 B1 * | 9/2001 | Gowni et al. | 716/1 |
| 6,360,191 B1 * | 3/2002 | Koza et al. | 703/6 |

OTHER PUBLICATIONS

G. Kron, "Diakoptics–Piecewise Solution of Large–Scale Systems", 1963, Macdonald, London.

F. H. Branin, "The Relation Between Kron's Method and the Classical Methods of Network Analysis", Mar. 1962, The Matrix and Tensor Quarterly, vol. 12, No. 3, pp. 69–115.

L. O. Chua and L. K. Chen, "Diakoptic and Generalized Hybrid Analysis", Dec. 1976, IEEE Transactions on Circuits and Systems, vol. CAS–23, No. 12, pp. 694–705.

F. F. Wu, "Solution of Large–Scale Networks by Tearing", Dec. 1976, IEEE Transactions on Circuits and Systems, vol. CAS–23, No. 12, pp. 706–713.

L. O. Chua and L. K. Chen, "Nonlinear Diakoptics", Apr. 1975, Proceedings 1975 IEEE International Symposium On Circuits and Systems, pp. 373–376.

K. U. Wang and T. Chao, "Diakoptics for Large Scale Nonlinear Time–Varying Networks", Apr. 1975, Proceedings 1975 IEEE International Symposium on Circuits and Systems, pp. 277–278.

A. Sangiovanni–Vincentelli, L. K. Chen and L. O. Chua, "A New Tearing Approach–Node Tearing Nodal Analysis", Apr. 1975, 1977 IEEE International Symposium on Circuits and Systems Proceedings, pp. 143–147.

P. Linardis, K. G. Nichols and E. J. Zaluska, Network Partitioning and Latency Exploitation in Time–Domain Analysis of Nonlinear Electronic Circuits, May 1978, 1978 IEEE International Symposium on Circuits and Systems Proceedings, pp. 510–513.

N. B. Rabbat and H. Y. Hsieh, "A Latent Macromodular Approach to Large–Scale Sparse Networks", Dec., 1976, IEEE Transactions on Circuits and Systems, vol. CAS–23, No. 12, pp. 745–752.

N. B. Rabbat and H. Y. Hsieh, "Concepts of Latency in the Time–Domain Solution of Nonlinear Differential Equations", May 1978, 1978 IEEE International Symposium on Circuits and Systems Proceedings, pp. 813–825.

C. W. Ho, A. E. Ruehli and P. A. Brennan, "The Modified Nodal Approach to Network Analysis", Jun., 1975, IEEE Transactions on Circuits and Systems, vol. CAS–22, No. 6, pp. 504–509.

I. N. Hajj, "Sparsity Considerations in Network Solution by Tearing", May 1980, IEEE Transactions on Circuit and Systems, vol. CAS–27, No. 5, pp. 357–366.

A. E. Ruehli, A. L. Sangiovanni–Vincentelli and N. B. Rabbat, "Time Analysis of Large Scale Circuits Containing One–Way Macromodels", Apr. 1980, 1980 IEEE International Symposium on Circuits and Systems Proceedings, pp. 766–770.

N. B. Rabbat, A. L. Sangiovanni–Vincentelli, and H. Y. Hsieh, "A Multilevel Newton Algorithm With Macromodeling and Latency for the Analysis of Large–Scale Nonlinear Circuits in the Time Domain", Sep. 1979, IEEE Transactions on Circuits and Systems, vol. CAS–26, No. 9, pp. 733–741.

H. Y. Hsieh and N. B. Rabbat, Multilevel Newton Algorithm for Nested Macromodel Analysis of Bipolar Networks, Apr., 1980, 1980 IEEE International Symposium on Circuits and Systems Proceedings, vol. 1, pp. 762–765.

M. C. Chang and I. N. Hajj, "iPRIDE" A Parallel Integrated Circuit Simulator Using Direct Method, Nov., 1988, IEEE International Conference on Computer–Aided Design, pp. 304–307.

P. Cox, R. Burch, D. Hocevar and P. Yang, "SUPPLE: Simulator Utilizing Parallel Processing and Latency Exploitation", Nov. 1987, IEEE International Conference on Computer–Aided Design, pp. 368–371.

G. Bischoff and S. Greenberg, "CAYENNE: A Parallel Implementation of the Circuit Simulator Spice", Nov. 1986, IEEE International Conference on Computer–Aided Design, pp. 182–185.

G. K. Jacob, A. R. Newton and D. O. Pederson, "An Empirical Analysis of the Performance of a Multiprocessor–Based Circuit Simulator", Jun., 1986, $23^{rd}$ Design Automation Conference, pp. 588–593.

C. P. Yuan, R. Lucas, P. Chan and R. Dutton, Parallel Electronic Curcuit Simulation on the iPSC System, May, 1988, IEEE 1988 Custom Integrated Circuits Conference, pp. 6.5.1–6.5.4.

J. T. Deutsch and A. R. Newton, A Multiprocessor Implementation of Relaxation–Based Electrical Circuit Simulation, $21^{st}$ Design Automation Conference, pp. 350–357.

A. Vladimirescu and D. O. Pederson, "Circuit Simulation on Vector Processors", Sep.–Oct., 1982, IEEE International Conference on Circuits and Computers, pp. 172–175.

B. Greer, "Converting SPICE to Vector Code", Jan., 1986, VLSI System Des. vol. VII, pp. 30–32.

Ping Yang, "An Investigation of Ordering, Tearing, and Latency Algorithms for the Time–Domain Simulation of Large Circuits", 1980, Graduate College of the University of Illinois at Urbana–Champaign.

Yoshida T., "Speed Up Of An Evaluation Speed 5–15 Times Faster By Using Hierarchical Power Supply Network," NTT LSI Lab, pp. 87–92.

Hall, et al, "A CAD System For ,Modeling Voltage Drop And Electromigration In VLSI Metallization Patterns," Texas instruments Technical journal, vol. 5, No. 3, pp. 74–78, May–Jun. 1988.

Chowdury S., "An Automated Design of Minimum–Area IC Power/Ground Nets", $24^{th}$ ACM/IEEE Design Automation Conference, pp. 223–229, Jun. 1987.

Dalal, et al, "Design of an Efficient Power Distribution Network for the UltraSPARC–1™ Microprocessor", IEEE International Conference on computer Design, ICCD–95, pp. 118–123, Oct. 1995.

An–Chang Deng, "Power Analysis For CMOS/Bicmos Circuits", Workshop Proceedings, International Workshop on Lower–Power Design, pp. 3–8, Apr. 1994.

Deng, et al, "Time Domain Current Waveform Simulation of CMOS Circuits", IEEE International conference if Computer–Aided Design, ICCAD–88, pp. 208–211, Nov. 1988.

Dutta et al, "Automatic Sizing Of Power/Ground (P/G) Networks In VLSI", $26^{th}$ ACM/IEEE Design Automation Conference, pp. 783–786, Jun. 1989.

Kang, et al, Automated Extraction of SPICE Circuit Models from Symbolic Gate Matrix Layout With Pruning, $23^{rd}$ Design automation Conference, IEEE, pp. 418–462, Jun. 1986.

Frost, et al, "RELIANT: A Reliability Analysis Tool for VLSI Interconnects", IEEE Journal Of Solid–State Circuits, vol. 24, No. 2, pp. 458–462, Apr. 1989.

Hall, et al, "SPIDER–A CAD System for Modeling VLSI Metallization Patterns", IEEE Transactions On Computer–Aided Design, vol. CAD–6, No. 6, Nov. 1987.

Holol, et al, "RELIC: A Reliability Simulator For Integrated Circuits", IEEE International Conference on Computer–Aided Design, ICCAD–86, pp. 517–520. Nov. 1986.

Kerns, et al, "Stable And Efficient Reduction of Large, Multiport RC Networks by Pole Analysis via Congruence Transformations", $33^{rd}$ ACM/ICEE Design Automation Conference, pp. 280–285, Jun. 1996.

Kriplani Harish, Ph.D., Worst Case Voltage Drops in Power and Ground Buses of CMOS VLSI Circuits, Ph.D. Thesis, University Of Illinois at Urbana–Champaign, 1994, 124 pages.

Harish, et al, Worst Case Voltage Drops in Power and Ground Buses of CMOS VLSI Circuits, SCR TECHNON '93 Conference, Atlanta, GA, pp. 402–404, Sep. 1993.

Liao, et al, "Partitioning and Reduction of RC Interconnect Networks Based on Scattering Parameter Macromodels".

Liew, et al, Circuit Reliability Simulator for Interconnect, Via, and Contact Electromigration, IEEE Transactions on Electron Devises, vol. 39, No. 11, pp. 2472–2479, Nov. 1992.

Mitsuhashi, et al, "Power And Ground Network Topology Optimization For Cell Based VLSI's", $29^{th}$ ACM/IEEE Design automation conference, pp. 524–529, Jun. 1992.

A. Richard Newton, "The Simulation of Large–Scale Integrated Circuits", Memorandum No. UCB/ERL M78/52, Electronics Research Laboratory, College of Engineering, UC Berkeley, Jul. 1978.

Shue, et al, "An Integrated–Circuit Reliability Simulator–RELY", IEEE Journal of Solid–State Circuits, vol. 24, No. 2, pp. 473–477, Apr. 1989.

Stanisic, et al, "Addressing Substrate Coupling in Mixed–Mode IC's: Simulation and Power Distribution Synthesis", IEEE Journal of Solid–State Circuits, vol. 29, No. 3, pp. 226–238, Mar. 1994.

Stanisic, et al, "Mixed–Signal Noise–Decoupling via Simultaneous Power Distribution Design and Cell Customization In Rail", IEEE 1994 Custom Integrated Circuits Conference, pp. 533–536, May 1994.

Don Stark, Ph.D. "Analysis of Power Supply Networks in VLSI Circuits", Ph.D. diss., Stanford University, Dec. 1991, 143 pages.

Stark, et al, "Analyzing CMOS Power Supply Networks using Ariel", $25^{th}$ IEEE Design Automation Conference, pp. 460–464, Jun. 1988.

Stark, et al, "Techniques for Calculating Currents and Voltages in VLSI Power Supply Networks", IEEE Transaction on Computer–Aided Design, vol. 9, No. 2, pp. 126–132, Feb. 1990.

Tao, et al, "An Electromigration Failure Model for Interconnects Under Pulsed And Bidirectional Current Stressing", IEEE Transactions on Electron Devices, vol. 41, No. 4, pp. 539–545, Apr. 1994.

Teng, et al, "Hierarchical Electromigration Reliability Diagnosis for VLSI Interconnects", $33^{rd}$ ACM/ICEE Design Automation Conference, pp. 752–757, Jun. 1996.

Chin–Chi Teng, "Hierarchical Electromigrration Reliability Diagnosis For ULSI Interconnects", Ph.D. thesis, University of Illinois at Urbana–Champaign, 1996.

Tiwary, G., "Below the Half–Micron Mark", IEEE Spectrum, pp. 84–87, Nov. 4, 1994.

Akhilesh Tyaga, "Hercules: A Power for MOS VLSI Circuits", IEEE Spectrum, pp. 530–533, Nov. 1987.

Takeshi Yoshitome, "Hierarchical Analyzer for VLSI Power Supply Networks Based on a New Reduction Method", IEEE International Conference on Computer–Aided Design, ICCAD–91, pp. 298–301, Nov. 1991.

* cited by examiner

TRANSISTOR LEVEL CIRCUIT SIMULATOR USING HIERARCHICAL DATA

BACKGROUND OF THE INVENTION

1. Field of the Invention

The present invention relates to computer-aided design tools. More particularly, the present invention relates to the simulation of circuits using a hierarchical data structure and applying isomorphism matching to skip computations on duplicate subcircuit behavior.

2. Description of the Related Art

Device-level circuit simulation is an important step in microelectronic circuit design. Through such simulation, the functionality of a circuit may be validated and performance of the circuit may be predicted before the circuit is physically fabricated. The application of existing simulation tools such as SPICE, however, is limited to the simulation of small subcircuit blocks, typically less than 100,000 transistors, due to their memory capacity and performance limitations.

The capacity of existing simulators is primarily determined by the size of the circuit being simulated. Although circuits are hierarchically structured, the circuit hierarchy is typically flattened to the device level during simulation. As a result, the device connectivity and device parameters are stored during simulation for each device. This is particularly important since there is a fixed memory overhead measured in bytes per device. It follows that memory usage during circuit simulation is approximately proportional to the circuit size measured in number of devices in the circuit. In existing simulators, the memory usage per device is in the order of hundreds of bytes. This means that approximately 1 G bytes (one billion bytes) of memory are required in order to simulate a circuit containing 10 million devices, assuming 100 bytes of memory are required per device. The excessive memory usage therefore makes it impractical to use existing circuit simulators to perform full-chip circuit simulation on today's VLSI circuits. For example, a 256 M DRAM chip contains more than 256 million transistors and no existing circuit simulator can perform the full-chip simulation on the 256 M DRAM circuit. This memory limitation therefore forces microelectronic circuit designers to partition the full-chip design into blocks of smaller subcircuits which can be simulated by existing circuit simulators. Thus, the circuit is partitioned into subcircuits and the separate simulation results for the partitioned subcircuits are relied upon to predict the full-chip circuit behavior. However, the circuit partitioning is a tedious and error-prone task and thus reduces the designer's productivity. Moreover, the simulated subcircuit behavior obtained by local subcircuit simulation may be different from that obtained if the subcircuit is simulated together with all other subcircuits. Accordingly, it would be desirable if large microelectronic circuits could be simulated without such partitioning.

As described above, the size of the circuit that may be simulated using currently available circuit simulators is limited. However, even those circuits that can be simulated using currently available circuit simulators require a substantial amount of simulation time as well as memory. This becomes evident from the fact that the behavior of a circuit, as well as the behavior of each subcircuit, is formulated into a set of mathematical equations which are solved during simulation. Typically, the circuit hierarchy is flattened to the device level and numerical analysis is applied to the mathematical equations that are formulated from the flattened data. Since the mathematical equations are formulated at the device level, the computations required increase with the number of devices in the circuit. However, as described above, a large circuit may contain millions of devices and therefore the electrical behavior of the circuit may be expressed by millions of equations. As a result, the circuit can be time-consuming to simulate. Accordingly, the cost of testing such a circuit is non-trivial.

Although simulators having reduced simulation time have been developed, such improvements have generally been achieved through relaxing the accuracy of the simulation results. In addition, some simulators such as PowerMill available from Synopsys Inc., located in Mountain View, Calif. have achieved an increase in circuit simulation speed by taking advantage of circuit latency found in digital CMOS circuits. Thus, these simulators skip computations for idle subcircuits. However, the applicability of such simulators is limited to digital CMOS circuits. In addition, the assumption of circuit latency is getting invalidated by analog behavior arising in today's deep submicron technology. For example, due to noise from crosstalk capacitances, each device could be physically active all the time even though it is functionally idle most of the time. Therefore, although SPICE and other faster circuit simulators continue to play a critical role in microelectronic circuit simulation, the demand for more efficient circuit simulation is increasing.

To meet the challenge of simulating very large circuits containing millions of transistors, a simulation technology known as macromodeling has been implemented. Through the use of macromodeling, the electrical behavior of a subcircuit is characterized and the subcircuit is replaced by its behavioral model. Since this approach skips the details of a subcircuit and replaces it with an abstract model, the macromodeling approach consumes a minimal amount of memory. In addition, the simulation speed is much faster since it operates on a simpler behavioral description instead of massive numerical data. Theoretically, this approach can therefore be used to simulate a circuit of unlimited size. However, such approximate characterization of subcircuit behavior cannot accurately simulate the behavior of the entire circuit. Moreover, this approach requires a nontrivial effort to build the model since the modeling process is circuit dependent. Model characterization is tedious and time-consuming since it needs to include different combinations of input patterns and output load conditions. In addition, the subcircuit must be recharacterized whenever the subcircuit topology and circuit parameters change. Due to the difficulty in building the behavioral model, this macro-modeling approach is limited to applications where the subcircuit size is small or the subcircuit behavior is less sensitive to the surrounding environment. It would therefore be desirable if circuit simulation could be performed without such characterization.

In view of the above, it would be desirable if the simulation time and memory consumed during circuit simulation could be reduced. Moreover, a new technology is needed to allow a circuit simulator to perform full-chip simulation on circuits containing hundreds of million transistors, whether such circuits exist today or will emerge in the next decade.

SUMMARY OF THE INVENTION

The present invention implements methods and apparatus for validating the functionality and performance of microelectronic circuits prior to fabrication. More particularly, the present invention may be advantageously used to accurately simulate the electrical behavior of very large microelectronic circuits. This is accomplished, in part, through exploiting the hierarchical architecture in microelectronic circuit design.

Currently available circuit simulators have not used the hierarchical architecture of microelectronic circuits to benefit the simulation process. Rather, even when a hierarchical data structure is produced from a netlist representing the circuit being simulated, the hierarchical data structure is typically flattened during the simulation process. In other words, the memory required during simulation is proportional to the number of devices in the circuit being simulated. Similarly, the number of computations performed during the simulation process increases with the number of devices in the circuit. In order to reduce the simulation time and memory required during simulation, the circuit is often partitioned. However, such partitioning can introduce errors into the simulation process and therefore reduces the accuracy of the resulting simulation.

In order to utilize the hierarchical architecture to simulate the electrical behavior of a circuit, the present invention uses a hierarchical data structure throughout the simulation process. More particularly, a netlist describing the circuit may be parsed to permit the information in the netlist to be stored in a hierarchical data structure. However, it is particularly important that the hierarchical data structure be constructed in a manner that facilitates the simulation process. As will be described below, through the use of such a hierarchical data structure, memory requirements as well as the number of computations performed during simulation may be dramatically reduced.

According to the present invention, the hierarchical data structure is designed to maximize the benefits that may be obtained from the hierarchical architecture of microelectronic circuits. In many circuits, identical subcircuits are often used multiple times within the same circuit. By way of example, an inverter may be used repeatedly within a circuit. As yet another example, in memory arrays, numerous memory cells may be used within a single memory circuit. As a result, these identical subcircuits may share a common circuit structure or subcircuit definition. By way of example, a subcircuit definition may describe the topology of the subcircuit as well as the device parameters of the subcircuit (e.g., resistance, capacitance, and transistor size). Alternatively, the device parameters may be specified in corresponding element definitions provided in leaf nodes that are linked to the subcircuit definition. According to one embodiment, the topology of the subcircuit is represented by a block matrix. Since multiple child subcircuits may be associated with a single subcircuit definition, it is desirable to combine such subcircuits or "instances" in memory. Thus, multiple subcircuits may share a single static circuit storage area in which the subcircuit definition is stored. In this manner, memory consumed during the simulation process may be minimized.

While multiple circuits may share such static circuit storage, the circuits may have different node voltages at a specified time and therefore different "dynamic voltage states". Thus, a set of voltage states may be associated with each subcircuit definition. However, where node voltages are determined to be identical for more than one subcircuit during simulation, the subcircuits may also share a common dynamic voltage state. As a result, the voltage state associated with multiple nodes (e.g., child subcircuits) in the hierarchical data structure may be linked to a single voltage state. In this manner, memory use during simulation may be further reduced. It is important to note that through the use of the above-described hierarchical data structure, the memory storage required by the present invention is proportional to the number of different subcircuit types rather than the number of devices. In typical microelectronic circuits, the number of different subcircuit types is much less than the number of devices. By way of example, a standard 256 M DRAM circuit may contain 284 million devices and only 500 subcircuit types. Accordingly, the capacity limit faced by existing simulators is eliminated and the size of the circuit that may be simulated is therefore dramatically increased.

Where two subcircuits share a dynamic voltage state as well as a subcircuit definition, isomorphism may be applied to skip computations for these duplicate circuit blocks throughout the simulation process. According to one embodiment, the voltage state is updated for each subcircuit identified in the hierarchical data structure. As described above, each subcircuit is linked to a corresponding subcircuit definition and associated set of voltage states. As a result, the voltage state associated with a subcircuit need not be updated if the state has previously been updated for another subcircuit linked to the same subcircuit definition and voltage state. In other words, at a specific point in time during the simulation process, each one of the voltage states associated with a particular subcircuit definition need be updated only once, regardless of the number of subcircuits linked to the subcircuit definition and set of voltage states.

Once the voltage states have been updated, the device model is calculated for primitive elements in the circuit using the updated voltage states. As described above, where subcircuits share the same subcircuit definition and voltage state, the device model may be calculated a single time for the multiple subcircuits. Thus, the time required to calculate device models as well as total simulation time is dramatically reduced. Moreover, since the number of device model calculations during the simulation process is reduced, the memory required to store the reduced number of device model calculation results is similarly minimized.

Upon completion of the device model calculations, the behavior of the subcircuit may be simulated using the device model values and information associated with the subcircuit definition. More particularly, as described above, the behavior of each subcircuit may be represented by a set of equations in the form of a matrix. The matrix may then be loaded and solved using the device model calculations and the subcircuit definitions that are linked to the hierarchical data structure. According to one embodiment, a hierarchical block matrix is used to identify child subcircuits associated with each node in the hierarchical data structure. Once loaded with the appropriate values, the block matrices may be hierarchically solved. More particularly, the present invention may recursively simulate the behavior of each child subcircuit instance. Since most subcircuit instances not only share the same subcircuit definition but also exhibit the same behavior either throughout the simulation period or in sub-intervals of the simulation period, duplicate computations may be eliminated. By way of example, most sense amplifiers and core memory cells in memory circuits are observed to exhibit the same behavior during simulation. Thus, as indicated above, through the use of a hierarchical data structure, a circuit may be hierarchically simulated to skip the duplicate processing typically performed while simulating subcircuits with identical behavior. In this manner, the hierarchical nature of microelectronic circuits may be advantageously used to simulate the electrical behavior of a circuit while minimizing the simulation time and memory required. Accordingly, the present invention is superior to simulation tools that flatten the circuit hierarchy, particularly for circuits with a regular array structure such as memory circuits.

According to another aspect of the invention, the hierarchical netlist may be restructured to facilitate the simulation process. Where coupling between nodes in the circuit being simulated is equal to zero, the simulation process may be greatly simplified. This may become evident from examining a standard matrix. Where entries in the matrix are zero, the number of computations required is reduced. Thus, where coupling between the nodes in the circuit is represented by one or more entries in the matrix, it becomes evident that the number of computations may be greatly reduced where the coupling is zero. Through the use of equivalent impedance partitioning, it may be determined whether the coupling between nodes in the circuit may be approximated to zero and therefore effectively ignored during the simulation process. Thus, through examination of circuit parameters such as the equivalent resistance and frequency of operation of the circuit, it may be determined whether the coupling parameters may be approximated to zero.

Once it is determined whether the coupling parameters can be approximated to zero through the use of a method such as equivalent impedance partitioning, the hierarchical data structure may be modified through the use of a process such as hierarchical injection. Moreover, such restructuring may be limited to circuits that are large in size since restructuring may be unnecessary where the circuit and corresponding matrices are relatively easy to solve. According to one embodiment, such restructuring may be accomplished through the application of an algorithm such as the Min-Cut algorithm where a minimum number of nodes are selected and moved outside a subcircuit in order to partition the subcircuit. In this manner, subcircuits having an identical topology are created. Thus, it is likely that these newly created subcircuits may share both a subcircuit definition and a voltage state. Accordingly, memory requirements and simulation time may be minimized through preprocessing performed prior to transient simulation.

According to yet another aspect of the invention, simulation of the circuit is achieved without flattening the hierarchical data structure. In existing simulation technology, the circuit hierarchy is flattened to the device level and numerical analysis is applied to the mathematical equations formulated from the flattened data. As a result, memory requirements and computations are proportional to the number of devices in the circuit. However, as described above, the hierarchical data structure may be processed hierarchically such as through a recursive process in order to eliminate such unnecessary calculations and memory requirements.

The present invention provides methods and apparatus for simulating the electrical behavior of a circuit without flattening the circuit hierarchy. More particularly, simulation is performed through the use of a hierarchical data structure to advantageously exploit the hierarchical nature of electronic circuits. In this manner, the memory consumed as well as the computations performed during the simulation process are minimized. Thus, the present invention enables microelectronic circuit designers to perform full-chip circuit simulation in a reduced simulation time. Accordingly, through the use of the present invention, circuits with more than 100 million transistors can be simulated, whereas existing circuit simulators can typically simulate a circuit having up to one million transistors.

DETAILED DESCRIPTION OF THE INVENTION

In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

Figure 1:
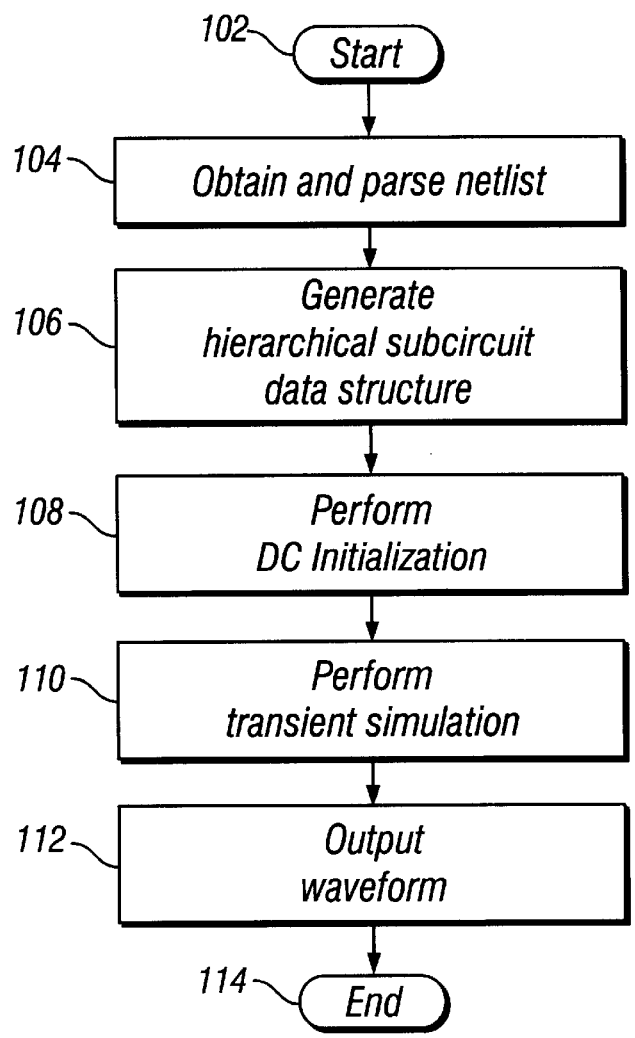
FIG. 1 is a flow diagram illustrating a method of simulating the electrical behavior of a circuit according to an embodiment of the invention.

Referring first to FIG. 1, a method of simulating the electrical behavior of a circuit according to an embodiment of the invention is illustrated. The method begins at block 102 and at block 104, a netlist describing the circuit is obtained and parsed. By way of example, the netlist may be generated from a commercial schematic entry system and may follow the same syntax format required when running SPICE. In order to simulate the behavior of the circuit, the netlist is parsed and a hierarchical data structure is generated from the parsed netlist at block 106. An exemplary hierarchical block matrix will be described in further detail below. The netlist may be converted into a hierarchical data structure using a method such as coupling connect partitioning. This data structure is referred to as hierarchical since it is based on the hierarchical view of each subcircuit rather than the flat view obtained by flattening the entire circuit to primitive elements such as transistors and resistors. Moreover, through a method such as coupling connect partitioning, the hierarchical data structure may be partitioned to facilitate the simulation of the circuit without flattening the hierarchical data structure. One method of performing coupling connect partitioning is described below with reference to FIG. 3.

In order to obtain the dynamic voltage state at the starting time t=0, DC initialization is performed at block 108. Transient simulation is then performed at block 110 to simulate the behavior of the circuit for a specified period of time. Once simulation is completed, a waveform may be output at block 112. The method ends at block 114.

It will be shown and described throughout the following description that each processing step of the present invention is performed on the hierarchical data structure, therefore providing significant performance advantages in memory usage as well as performance speed over traditional circuit simulators using the flat approach. Currently existing simulators flatten the hierarchical data structure to the lowest transistor level during simulation and therefore consume an enormous amount of memory proportional to the number of transistors in the circuit. In order to decrease the data storage space consumed during simulation, the present invention describes the netlist in a hierarchical format such that repetitive cells are described by a common subcircuit definition. More particularly, the data structure associated with each subcircuit definition may be generated above at block 106. Thus, the present invention provides a hierarchical circuit simulator that operates at the circuit level as well as the transistor level. Through storing equivalent circuit structures in the same storage, memory utilization is minimized. Thus, there is no limit to the size of the circuit that may be simulated by the present invention. Moreover, the simulation speed achieved through the use of the present invention is optimized through innovations in the hierarchical simulation algorithm, as will be described below.

Figure 2A:
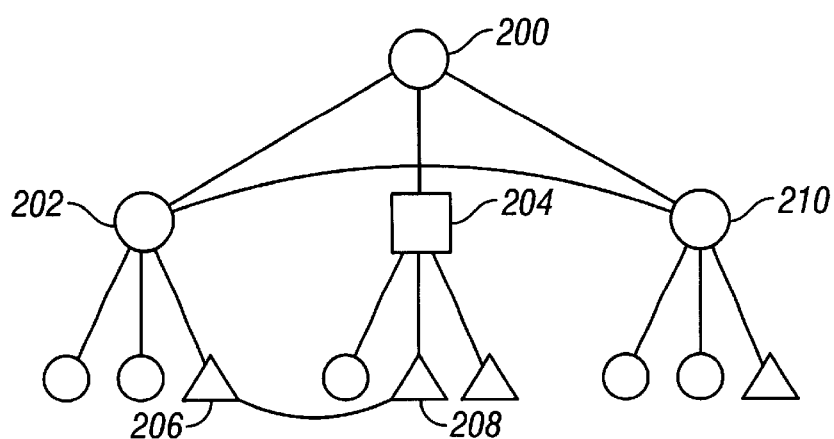
FIG. 2A is a general block diagram illustrating an exemplary hierarchical data structure storing a netlist according to an embodiment of the invention.

An exemplary hierarchical data structure storing netlist data according to an embodiment of the invention is illustrated in FIG. 2A. As shown, the hierarchical data structure includes root node 200 and multiple child nodes such that each subcircuit in the netlist is associated with a data structure. The term child node will hereinafter refer to a node that is present on a level of the hierarchy immediately below its parent node. Similarly, the term child instance will hereinafter refer to a subcircuit instance associated with a level of the hierarchy immediately below the current subcircuit (i.e., parent subcircuit). The root node 200 represents the top-level data while child nodes 202, 204, and 210 represent top-level subcircuit instances. As shown, each child may also be a parent of its own child nodes for lower-level subcircuits, such as nodes 206 and 208. Each subcircuit instance has an associated subcircuit definition. Where two or more child nodes are defined by the same subcircuit definition, the child nodes may share the same static subcircuit storage that contains the subcircuit topology and component parameters as well as defines the electrical circuit equations of the associated subcircuit. By way of example, the subcircuit topology may be defined through the use of a subcircuit definition. As yet another example, the component parameters may be provided through element definitions associated with the subcircuit definition. In addition, the electrical circuit equations of the associated subcircuit may be defined by a subcircuit block matrix equation, as will be shown and described with reference to FIG. 2B. By way of example, nodes 202 and 210 are shown to be defined by the same subcircuit definition and therefore have the same subcircuit topology. Similarly, child nodes 206 and 208 are shown to have an equivalent subcircuit structure and may therefore share the same static subcircuit storage. This may be accomplished through the use of pointers or other data structures. Node 204 is shown to have a unique subcircuit definition and therefore maintains its own static subcircuit storage. However, children of node 204, such as node 208, may still share storage with other nodes. Moreover, subcircuit storage may be shared by nodes on different levels of the hierarchy.

Figure 2B:
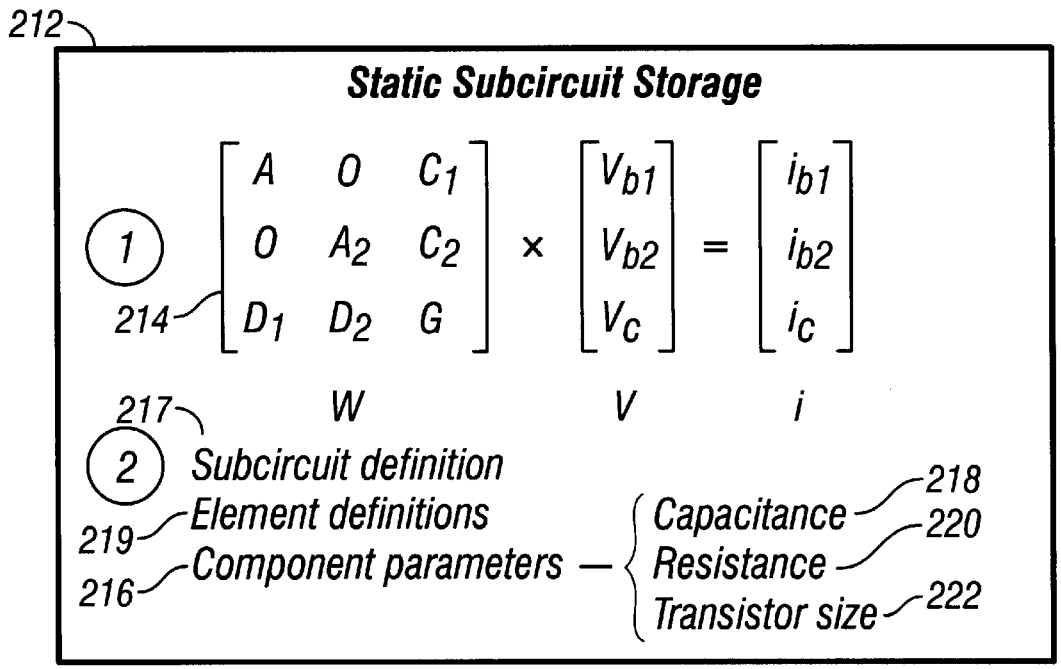
FIG. 2B is an exemplary diagram illustrating the contents of static subcircuit storage and matrix equation according to an embodiment of the invention.

In traditional circuit simulation, the circuit behavior is modeled and formulated by a set of matrix equations which are loaded and solved repetitively during simulation. Since the size of the matrix equation is proportional to the circuit size, it is inefficient to simulate large circuits. According to the present invention, the circuit behavior is modeled and formulated by a recursive block matrix equation which retains the hierarchical structure. Instead of flattening the entire circuit, the present invention formulates each subcircuit into a diagonal block matrix. An exemplary matrix equation for a subcircuit instance X with subcircuit definition S and containing two child instances $X_1$ and $X_2$ is shown in FIG. 2B. Throughout the following description, a subcircuit node of a subcircuit instance is defined as a node located within the subcircuit where the node is not a port node of the subcircuit. In addition, the subcircuit node is not located within any child instance of the subcircuit. Similarly, an internal node of a subcircuit instance is defined as a node located within the subcircuit and the node is not a port node. The difference between an internal node and a subcircuit node of a subcircuit is an internal node may be a node within a child subcircuit instance of the subcircuit while the subcircuit node cannot.

As described above, two or more subcircuits may share the same static subcircuit storage. As shown in FIG. 2B, the static subcircuit storage may include a representation of the behavior of the subcircuit in the form of a matrix equation, as shown at 214. More particularly, a block matrix associated with each subcircuit definition may be created at block 106 of FIG. 1. During simulation of the circuit, values are loaded into the block matrix and the matrix is solved at a specific time and voltage state. The elements of the matrix 214 are defined as follows:

W=block admittance matrix for subcircuit instance X $A_1$=block admittance matrix for subcircuit instance $X_1$ $A_2$=block admittance matrix for subcircuit instance $X_2$ $v_{b1}$=voltage vectors for internal nodes in subcircuit instance $X_1$ $v_{b2}$=voltage vectors for internal nodes in subcircuit instance $X_2$ $v_C$=voltage vectors for subcircuit nodes in subcircuit instance X $i_{b1}$=current vectors for internal nodes in subcircuit instance $X_1$ $i_{b2}$=current vectors for internal nodes in subcircuit instance $X_2$ $i_C$=current vectors for subcircuit nodes in subcircuit instance X G=admittance matrix for subcircuit nodes in subcircuit instance X $C_1$=admittance coupling matrix from subcircuit nodes of X to internal nodes of $X_1$ $C_2$=admittance coupling matrix from subcircuit nodes of X to internal nodes of $X_2$ $D_1$=admittance coupling matrix from internal nodes of $X_1$ to subcircuit nodes of X $D_2$=admittance coupling matrix from internal nodes of $X_2$ to subcircuit nodes of X The block matrix structure corresponding to each subcircuit definition may be generated during the preprocessing stage as shown at block 106 of FIG. 1.

Figure 2C:
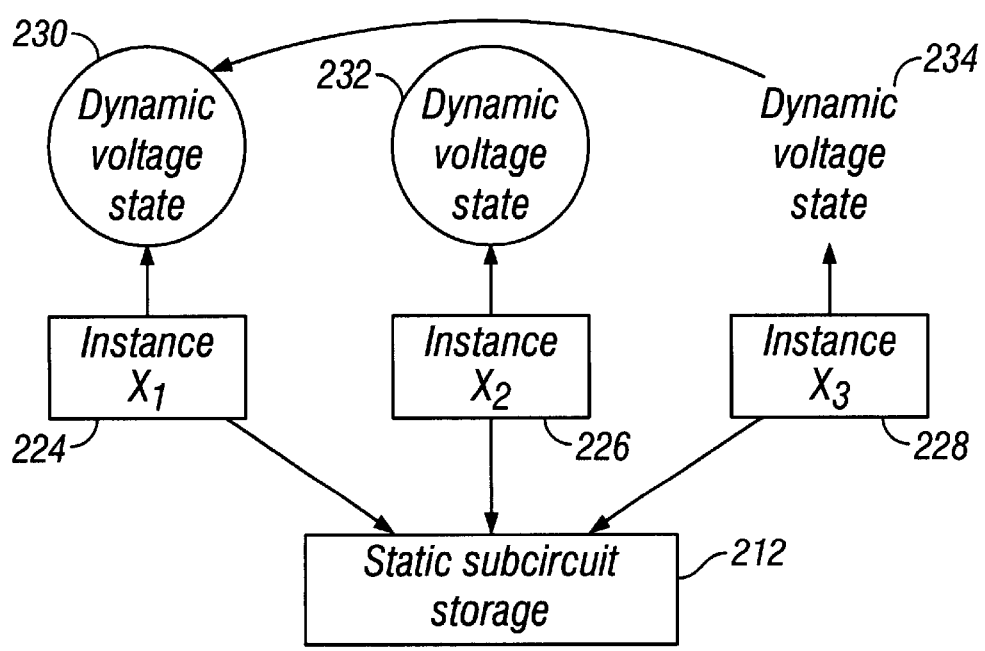
FIG. 2C is an exemplary block diagram illustrating the use of static subcircuit storage for multiple instances in combination with dynamic voltage state information for each instance.
Figure 2D:
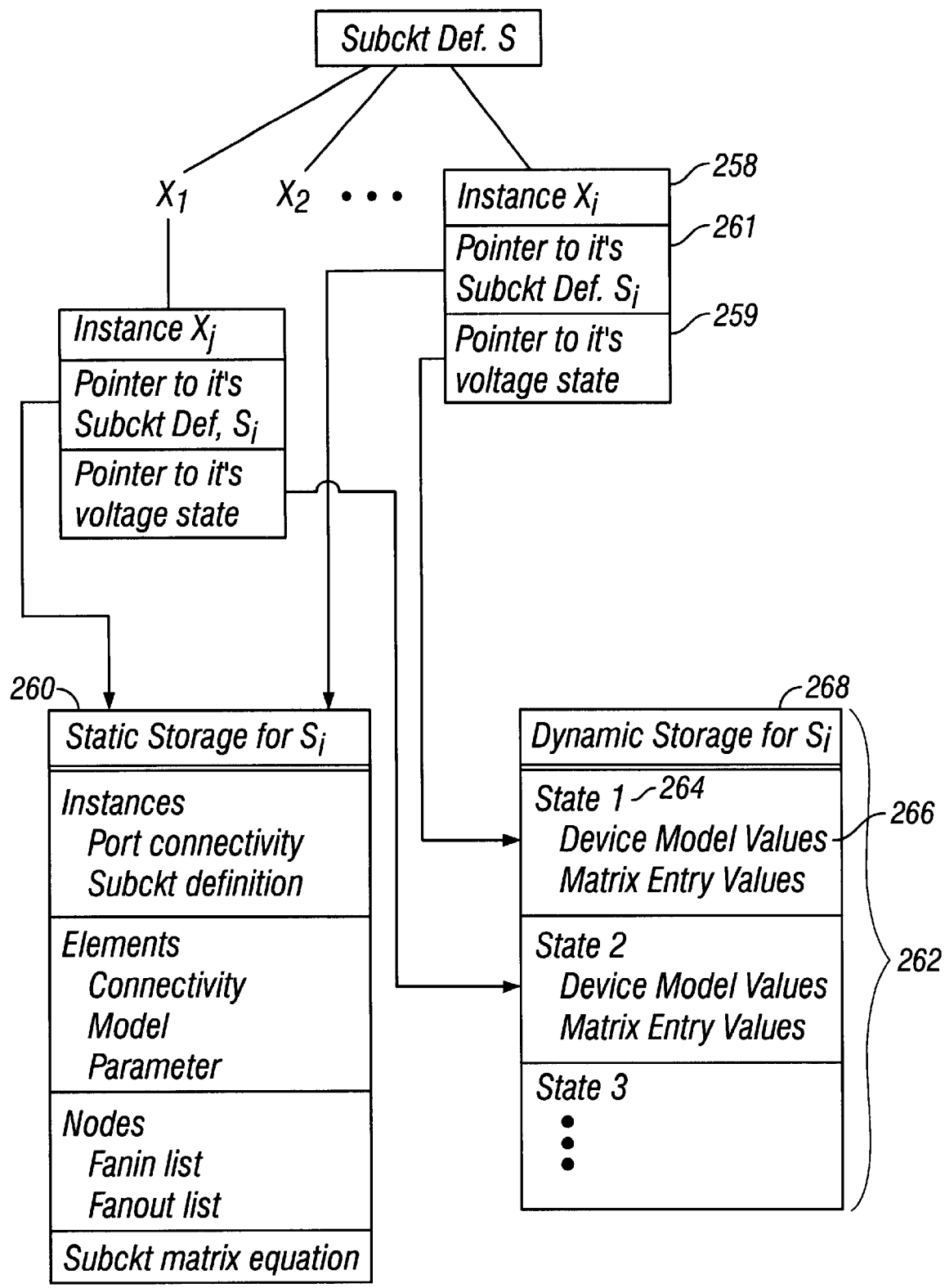
FIG. 2D is an exemplary block diagram illustrating one possible memory storage scheme.
Figure 2E:
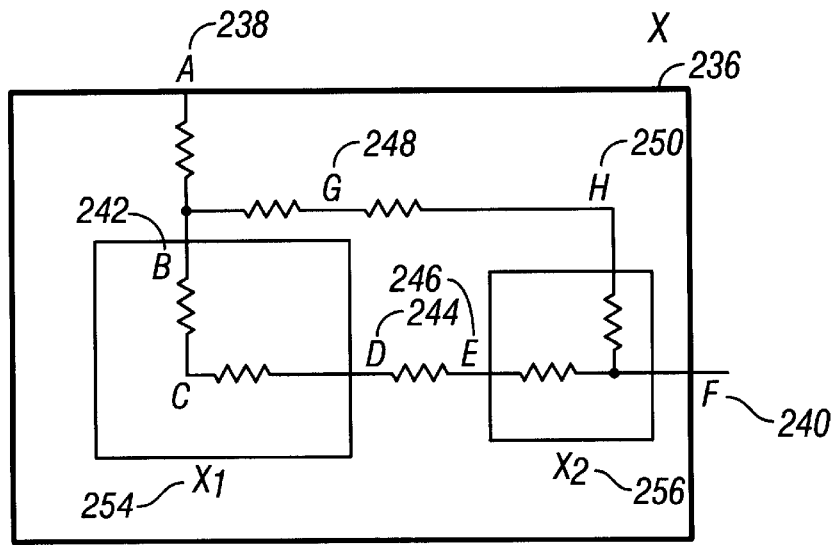
FIG. 2E is an exemplary circuit diagram illustrating the subcircuit nodes and internal nodes for a subcircuit X associated with a subcircuit definition S.

By way of example, FIG. 2E is a diagram illustrating a subcircuit X 236 associated with a subcircuit definition S which may be simulated through the use of the present invention. As shown, nodes A 238 and F 240 are port nodes of S, nodes B 242, D 244, E 246, G 248, and H 250 are subcircuit nodes of S, nodes B 242, C 252, D 244, E 246, G 248, and H 250 are internal nodes of S. In this example, since there is no direct connection between internal nodes of $X_1$ and $X_2$, the coupling matrices between them are therefore zero. Each matrix entry value is determined when the matrix is loaded as shown at block 720 of FIG. 8 and is calculated using circuit parameters 216 such as capacitance 218, resistance 220, and transistor conductance and capacitance 222, as well as current. The static storage may therefore store the matrix structure. As described above, the static subcircuit storage 212 may further include a subcircuit definition 217 that defines the subcircuit topology. In addition, the static subcircuit storage 212 may provide element definitions 219 associated with the subcircuit definition 217. Thus, each component parameter 216 may be associated with an element definition as well as the subcircuit definition 217. Similarly, during simulation, device model values calculated from these component parameters may be associated with the element/subcircuit definition as well as the voltage state. The entry values in the matrix are voltage-state dependent and are therefore determined according to the dynamic state as will be described below.

Even though some subcircuit instances with the same subcircuit definition may share the same static subcircuit storage, there is no guarantee that each one of them will exhibit the same behavior (or transient waveform) throughout the simulation time. However, there is a high probability that some instances will exhibit the same behavior if the behavior matching is performed only for the present time step. Based on this idea, the dynamic state of a subcircuit instance at time t is defined as the set of node voltages for all internal nodes and port nodes of the subcircuit measured at time t. It is important to note that the circuit simulation is advantageously accomplished by traversing a hierarchical data structure such as that illustrated in FIG. 2A without flattening the hierarchical data structure. According to the present invention, the reduction in computations as well as required memory may be achieved by eliminating the computations and storage for subcircuit instances with identical static subcircuit storage and dynamic state. As will be shown and described, during transient simulation, such duplicate storage and computations may be eliminated for subcircuit instances sharing static subcircuit storage and dynamic state.

In addition to sharing an equivalent circuit structure and therefore static subcircuit storage, two subcircuit instances may have an equivalent dynamic voltage state obtained during transient simulation. As shown in FIG. 2C, multiple instances 224, 226, 228 of the same subcircuit definition may share the same static subcircuit storage 212 as described above. In addition, the first instance 224 is shown to have a first dynamic voltage state 230 while the second instance 226 is shown to have a second dynamic voltage state 232. The third instance 228 has a third dynamic voltage state 234 identical to that of the first dynamic voltage state 230. In this case, there is no need to allocate a separate dynamic state for instance 228. Rather, one or more pointers or other mechanisms may be used to permit both the first instance 224 and the third instance 228 to share this dynamic voltage state. As shown, the third instance 228 may provide a pointer from the third dynamic voltage state 234 to the first dynamic voltage state 230. Alternatively, the dynamic voltage states may be represented as a set of voltage states associated with the specific subcircuit definition. Thus, each instance may provide its own pointer to the appropriate member of this set of dynamic voltage states.

FIG. 2D is an exemplary block diagram illustrating one possible memory storage scheme. As shown, an instance $X_i$ 258 has a corresponding subcircuit definition $S_i$ 260 provided in static subcircuit storage. In addition, a set of dynamic voltage states 262 is linked to the subcircuit definition 260. In this manner, the state 259 of the instance $X_i$ 258 may be linked to a dynamic voltage state 264 in the set of states 262. Similarly, the subcircuit definition 261 of the instance $X_i$ 258 may be linked to the subcircuit definition 260 provided in static storage. Thus, each of the voltage states in the set of states 262 may be shared by one or more instances that share the same subcircuit definition 260. Moreover, once calculated, the device model values 266 may be linked to the subcircuit definition 260 and the dynamic voltage state 264 in the set of dynamic voltage states 262. As shown in FIG. 2D, the device model values 266 and the set of states 262 are provided in dynamic storage 268. These dynamic voltage states are obtained and applied during transient simulation, which will be described in further detail with reference to FIGS. 7 through 17. During transient simulation, simulation steps such as device model calculation, loading the matrix equation, and solving the matrix equation are performed only once for all subcircuit instances sharing the same static subcircuit storage and dynamic state. This is particularly advantageous for simulation of large circuits, especially those with an array structure such as memory circuits.

Figure 3:
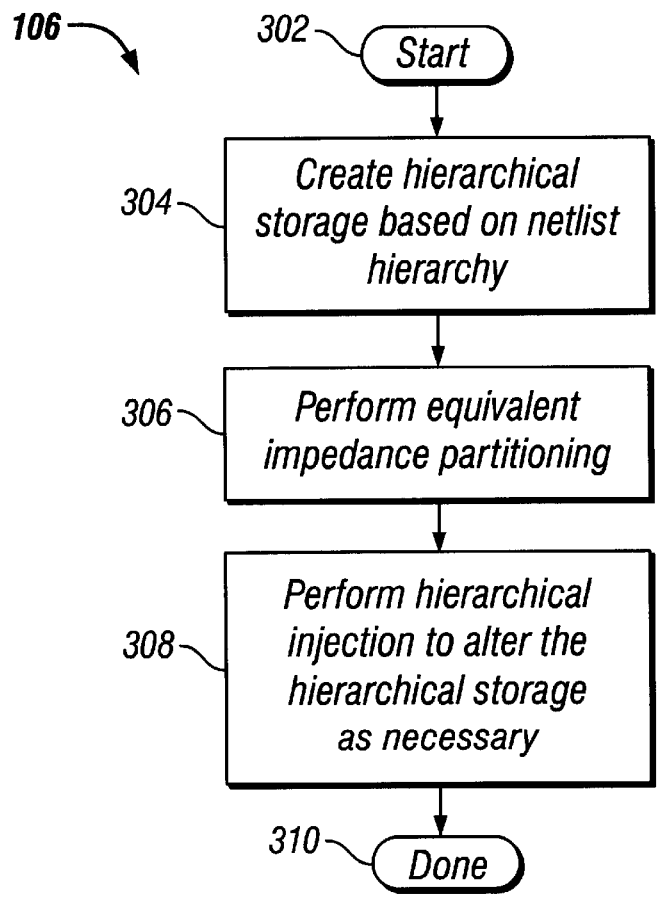
FIG. 3 is a flow diagram illustrating one method of performing coupling connect partitioning according to an embodiment of the invention.

As described above in block 106 of FIG. 1, the netlist is converted into a hierarchical data structure using coupling connect partitioning. The storage of the netlist within the hierarchical data structure may then be altered as necessary, according to the following method. The process begins at block 302 and at block 304, a hierarchical data storage is created based upon the netlist hierarchy as shown in FIG. 3.

It is next determined whether the coupling elements C and D may be ignored. As a practical approximation, where the coupling within the circuit is approximately zero, the coupling parameters or matrices may be set to zero. Thus, as shown with reference to the above equation, the equation may be solved with substantially reduced computations. Typically, the determination of whether the coupling elements may be ignored is accomplished through the use of channel-connect partitioning, as disclosed in U.S. Pat. No. 5,446,676. However, channel-connect partitioning is disadvantageous for several reasons. First, the hierarchical netlist is flattened during this process and therefore the process is time-consuming and expensive to perform. Second, the accuracy of channel-connect partitioning is less than desirable. Rather than examining the coupling strength parameter values determined by resistance, capacitance, and operating frequency, channel-connect partitioning ignores the coupling based on coupling element type. For example, the capacitive coupling between gate and drain (or source) terminals is ignored even though the coupling could be significant in the case of large MOS transistor size.

Figure 4:
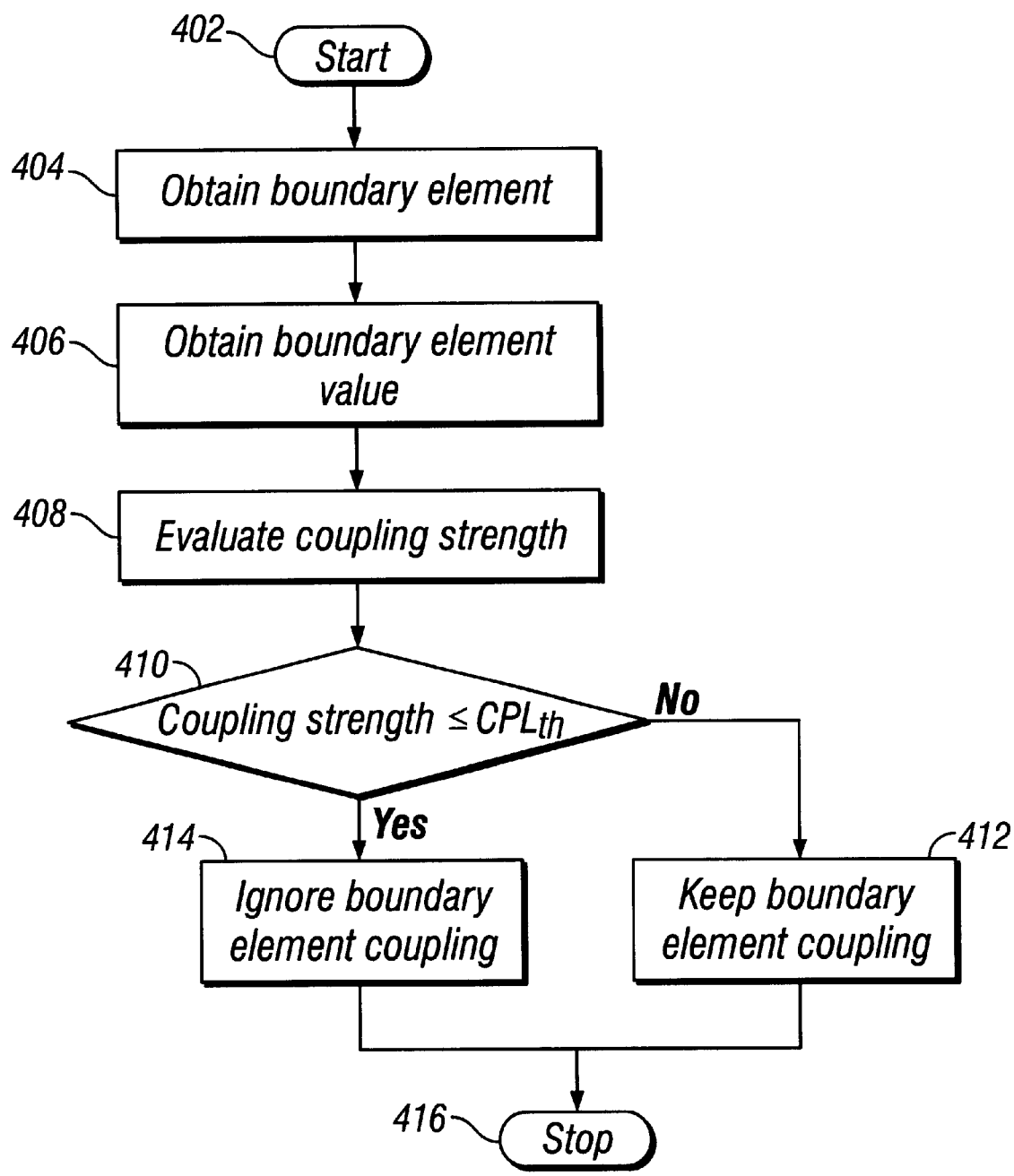
FIG. 4 is a flow diagram illustrating a method of performing equivalent impedance partitioning according to an embodiment of the invention.

It is important to note that in addition to examining the static topology of the circuit, the present invention also considers the parameters of the circuit to determine whether coupling parameters may be ignored. This is accomplished through the application of equivalent impedance partitioning at block 306. Equivalent impedance partitioning is described in further detail with reference to FIG. 4.

Once it is determined whether the coupling parameters may be ignored, the hierarchical data structure may be partitioned to simplify the simulation process. Since various circuits and their equivalent matrices are easier to solve than others, the hierarchical data structure may be restructured to facilitate the solving of the partitioned subcircuit matrices. Thus, hierarchical injection is performed as necessary at block 308 to alter the hierarchical storage. The process ends at block 310.

As shown above, equivalent impedance partitioning is performed at block 306 of FIG. 3. One method of performing equivalent impedance partitioning is presented in FIG. 4. Through the use of equivalent impedance partitioning, couplings between internal nodes and subcircuit nodes of each subcircuit are considered to determine whether to ignore the coupling parameters. The following process is performed for each subcircuit. The process begins at block 402 and at block 404, boundary elements to subcircuit ports are obtained. A boundary element is an element within the subcircuit and at least one terminal of the element is a subcircuit port. At block 406, the boundary element value (e.g., parameter value) is obtained. For a linear resistor element, the boundary element value is the resistor conductance (the inverse of resistance). For a linear capacitor, the boundary element value is its capacitance multiplied by the operating frequency, which may be specified by the user. For a nonlinear element such as a MOS transistor, the boundary element value is defined as the average drain-source conductance for coupling between drain and source terminals, and average gate-source capacitance multiplied by the operating frequency for gate-source coupling, and gate-drain capacitance multiplied by the operating frequency for gate-drain coupling. The coupling strength (e.g., conductance or inverse of the equivalent resistance) between each pair of boundary nodes (e.g., subcircuit port and internal node) of the subcircuit is estimated at block 408. The coupling strength is determined by adding the boundary element values for elements connected between this pair of nodes. At block 410, the coupling strength between each pair of subcircuit port and internal node of the subcircuit is compared with a coupling threshold, $CPL_{TH}$ that may be specified by a user. At block 412, if the coupling strength is higher than $CPL_{TH}$, then the coupling of the boundary element is significant and no simplification is performed. At block 414, if the coupling strength is less than $CPL_{TH}$, then the boundary element coupling is removed from the corresponding entry of coupling matrices C and D in FIG. 2B. The process ends at block 416. In this manner, coupling values may be approximated to zero and therefore effectively ignored where the coupling strength is estimated to be less than a specified coupling threshold, $CPL_{TH}$.

Figure 17:
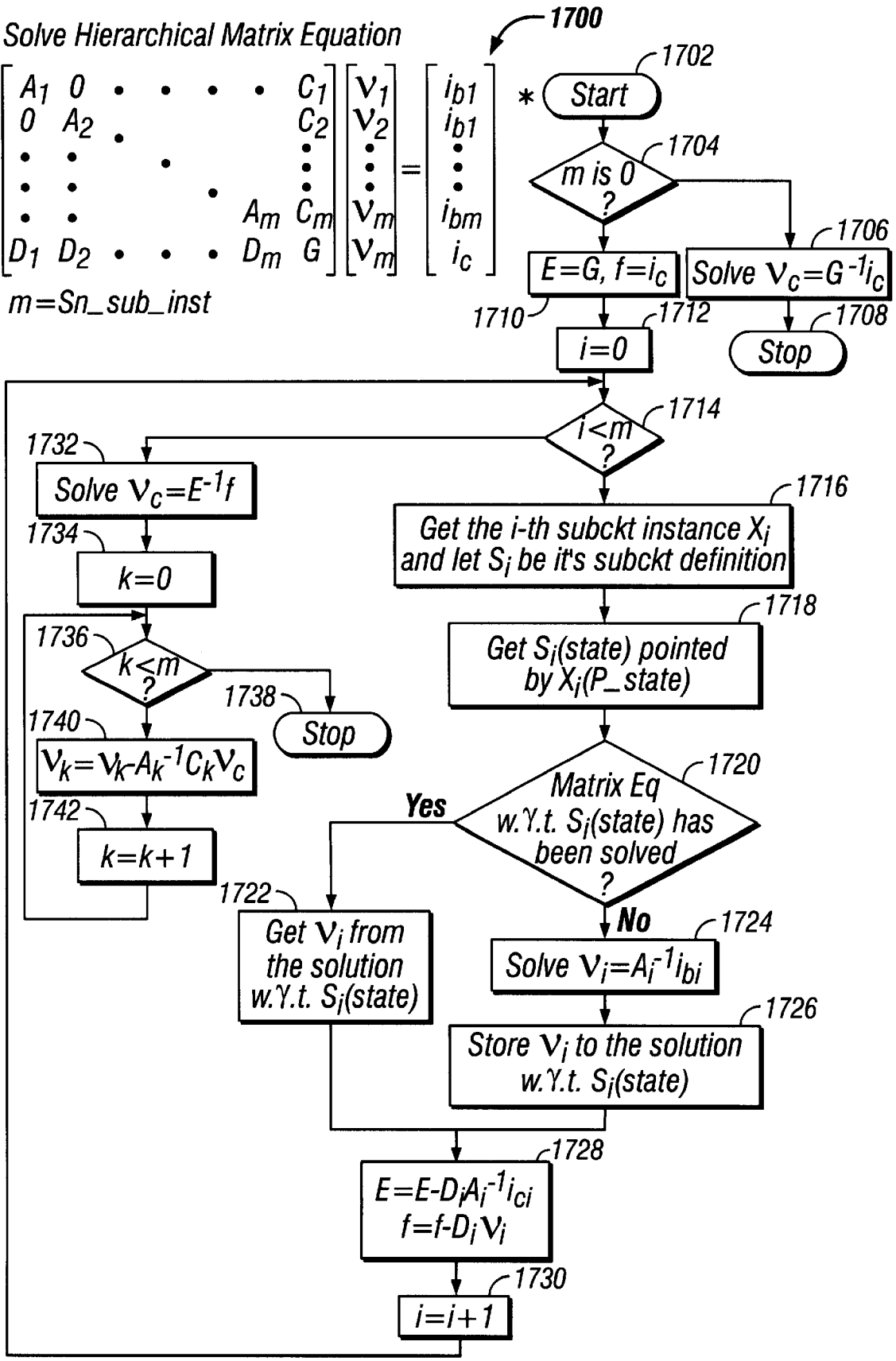
FIG. 17 is a flow diagram illustrating a method of solving a matrix equation hierarchically as shown at block 722 of FIG. 17.

As will be further described in FIG. 17, the subcircuit solution involves solving the matrix equation of FIG. 2B for each subcircuit instance with a certain voltage state. The solution, described in FIG. 17, is decomposed into recursive subtasks of solving its child instance and matrix equation of subcircuit nodes. In case the subcircuit has a large number of subcircuit nodes, the solution could take a long time since the matrix solution complexity is known to be superlinearly proportioned to the matrix size. The equivalent impedance partitioning shown at block 306 and in FIG. 4 may be performed to further decompose the subcircuit nodes into isolated groups such that the coupling between each pair of groups is approximated to zero, if it is less than the user-specified coupling threshold $CPL_{TH}$. Solving a group of isolated subcircuit nodes is more efficient since the superlinear complexity is reduced to a nearly linear complexity. Moreover, if some isolated groups share the same topology and behavior, redundant computations can be skipped.

In case the equivalent impedance partitioning fails to decompose a large set of subcircuit nodes such that the number of subcircuit nodes exceeds a pre-specified size limit $N_{size}$, then the hierarchical injection at block 308 is performed to move a selected set of subcircuit nodes out of the present subcircuit and introduce an additional level in the hierarchy, thereby decomposing subcircuit nodes into isolated groups.

Figure 5:
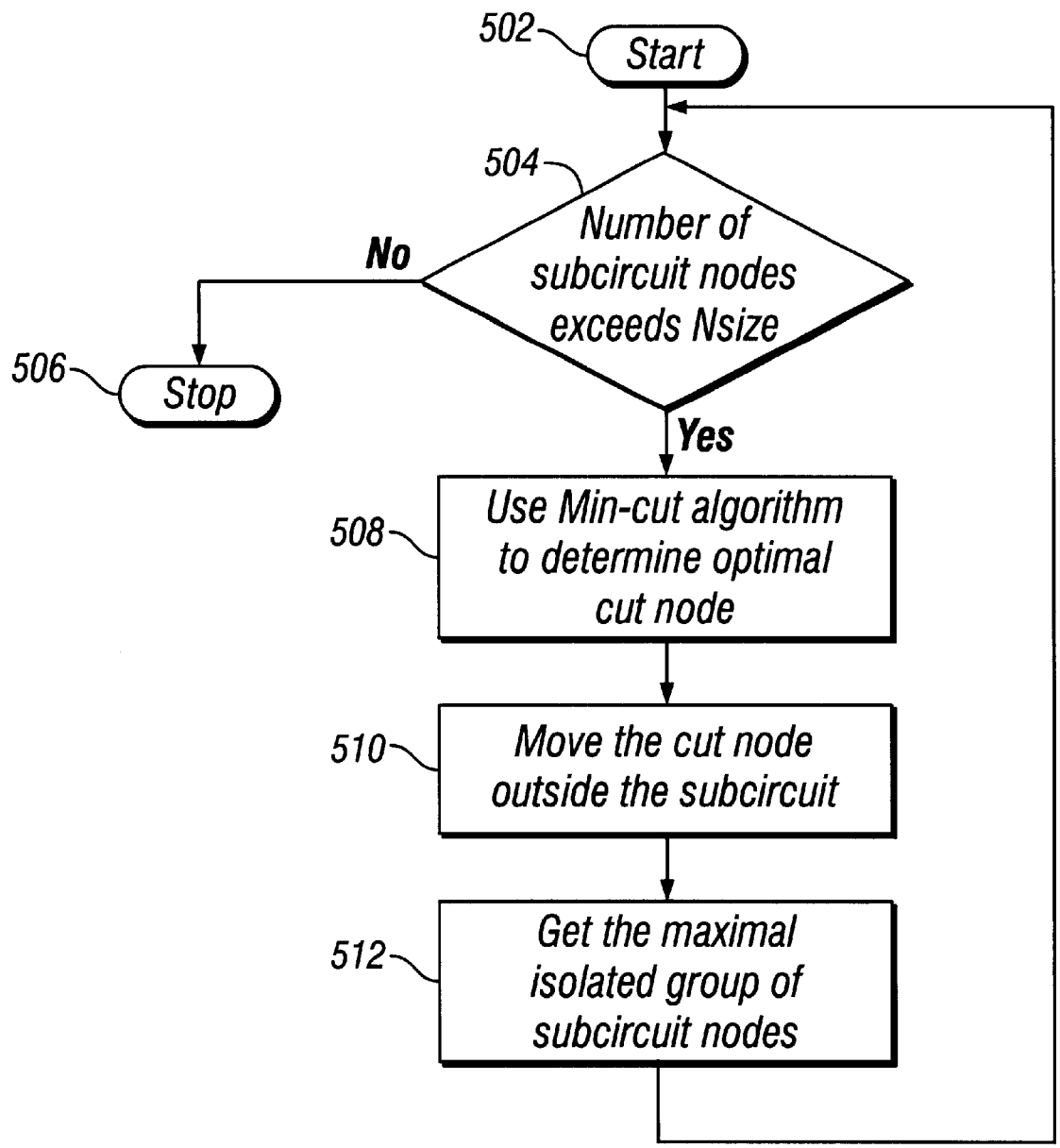
FIG. 5 is a flow diagram illustrating one method of performing hierarchical injection to restructure the hierarchical structure as shown at block 308 of FIG. 3 according to an embodiment of the invention.

One method of performing hierarchical injection is shown in FIG. 5. The hierarchical injection starts at block 502 of FIG. 5 and at block 504, the process compares the number of subcircuit nodes, which are coupled together after the equivalent impedance partitioning of block 306, with a pre-specified size limit $N_{size}$. If it is determined at block 504 that the number of subcircuit nodes is less than $N_{size}$, then the process ends at block 506 and there is no need to modify the hierarchical data structure. If it is determined that the number of subcircuit nodes exceeds $N_{size}$, then the Min-Cut algorithm is applied at block 508 to select the optimal cut node to decompose the subcircuit nodes into isolated groups such that the maximum group size is minimized. The Min-Cut algorithm is described in further detail as the Ford-Fulkerson Method in "Introduction to Algorithms" by Thomas H. Cormen et al., McGraw-Hill, 1990, which is hereby incorporated by reference for all purposes. An intermediate subcircuit hierarchy between the current subcircuit hierarchy and its parent hierarchy, is created at block 510 to collect the cut node selected at block 508. After the cut node is moved outside the current subcircuit hierarchy, the remaining subcircuit nodes may be decomposed into smaller isolated groups. The group containing the maximal number of subcircuit nodes is selected at block 512, and the iteration continues at block 504 to keep each group's size below the pre-specified limit $N_{size}$. Accordingly, the hierarchical data structure may be modified when the size of the subcircuit or corresponding matrix equation (e.g., measured by the number of subcircuit nodes or elements) is greater than a specified size.

Figure 6:
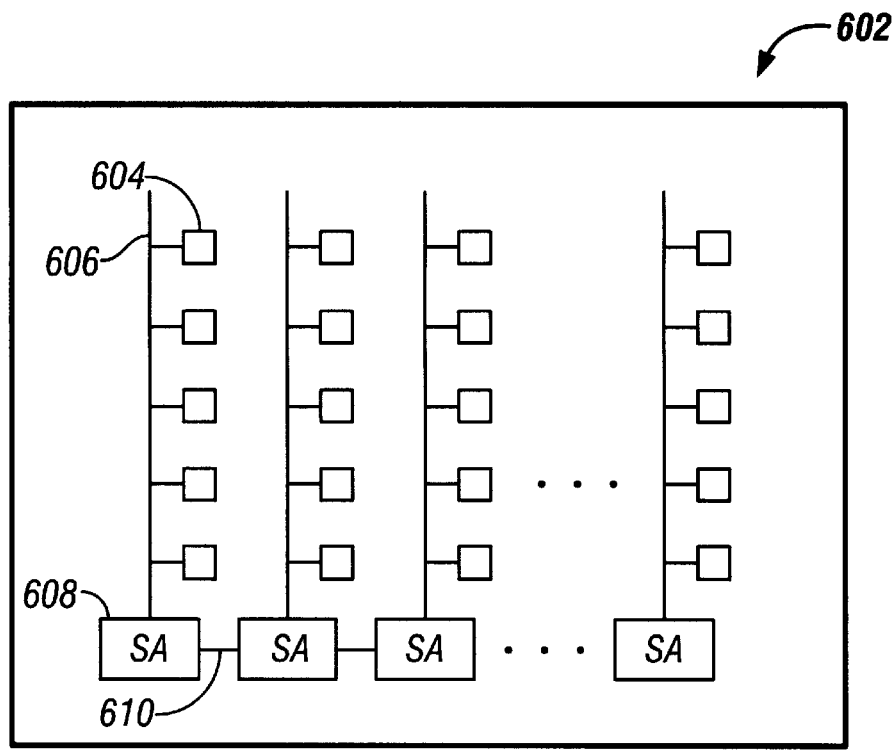
FIG. 6 is an exemplary diagram illustrating a memory circuit prior to application of hierarchical injection.
Figure 7:
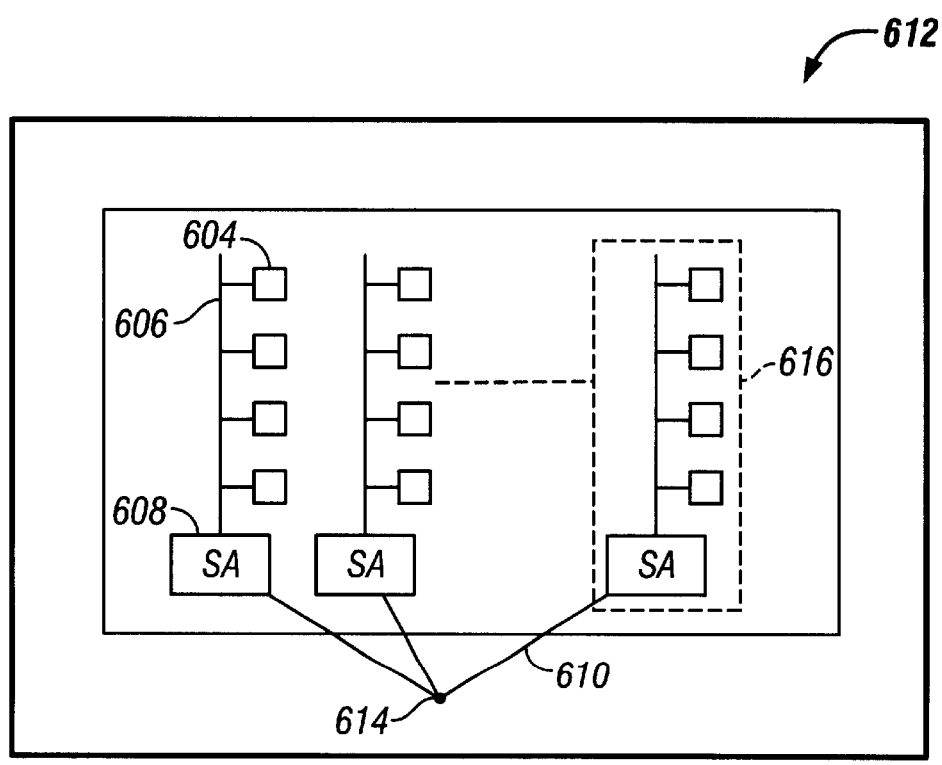
FIG. 7 is an exemplary diagram illustrating the memory circuit of FIG. 6 after application of hierarchical injection using the Min-Cut algorithm.

Referring now to FIG. 6 and FIG. 7, diagrams illustrating an exemplary application of hierarchical injection as described above in FIG. 5 are presented. As shown in FIG. 6, it may be desirable to simulate the electrical behavior of a subcircuit such as a DRAM 602. As shown, the DRAM 602 includes a plurality of memory cells 604, bit lines 606, and sense amplifiers 608 coupled to a bus 610. Since the number of bit lines is large and there may be a substantial amount of coupling, it is desirable to apply hierarchical injection to partition the subcircuit. More particularly, through creating partitions in the subcircuit, identical subcircuits may be formed. As a result, isomorphism may be applied to skip computations for the duplicate subcircuits.

FIG. 7 illustrates the subcircuit of FIG. 6 after the application of hierarchical injection. As shown, the common bus 610 connecting all the sense amplifiers is selected by the Min-cut algorithm and is pulled out of the current subcircuit 602 to become the subcircuit node 614 of a new subcircuit 612. As shown in FIG. 7, each bit line such as 606 is no longer coupled (or connected to) other bit lines after the common bus 610 is pulled out of the current subcircuit hierarchy 602. Moreover, each isolated group (formed by a bit line such as 606, a sense amplifier such as 608, and memory core cells such as 604) has the same topology and element parameters as any other group represented by 616. Most of these isolated groups can share not only the same static storage but also the dynamic state since most of the sense amplifiers and bit lines will have the same behavior. In this manner, a newly partitioned subcircuit 612 is created by selecting nodes (e.g., bus 610) to move outside the subcircuit 602. As a result, identical subcircuits 616 are isolated. Accordingly, once a subcircuit is partitioned, the hierarchical storage may be modified to reflect the partitioned subcircuit.

Figure 8:
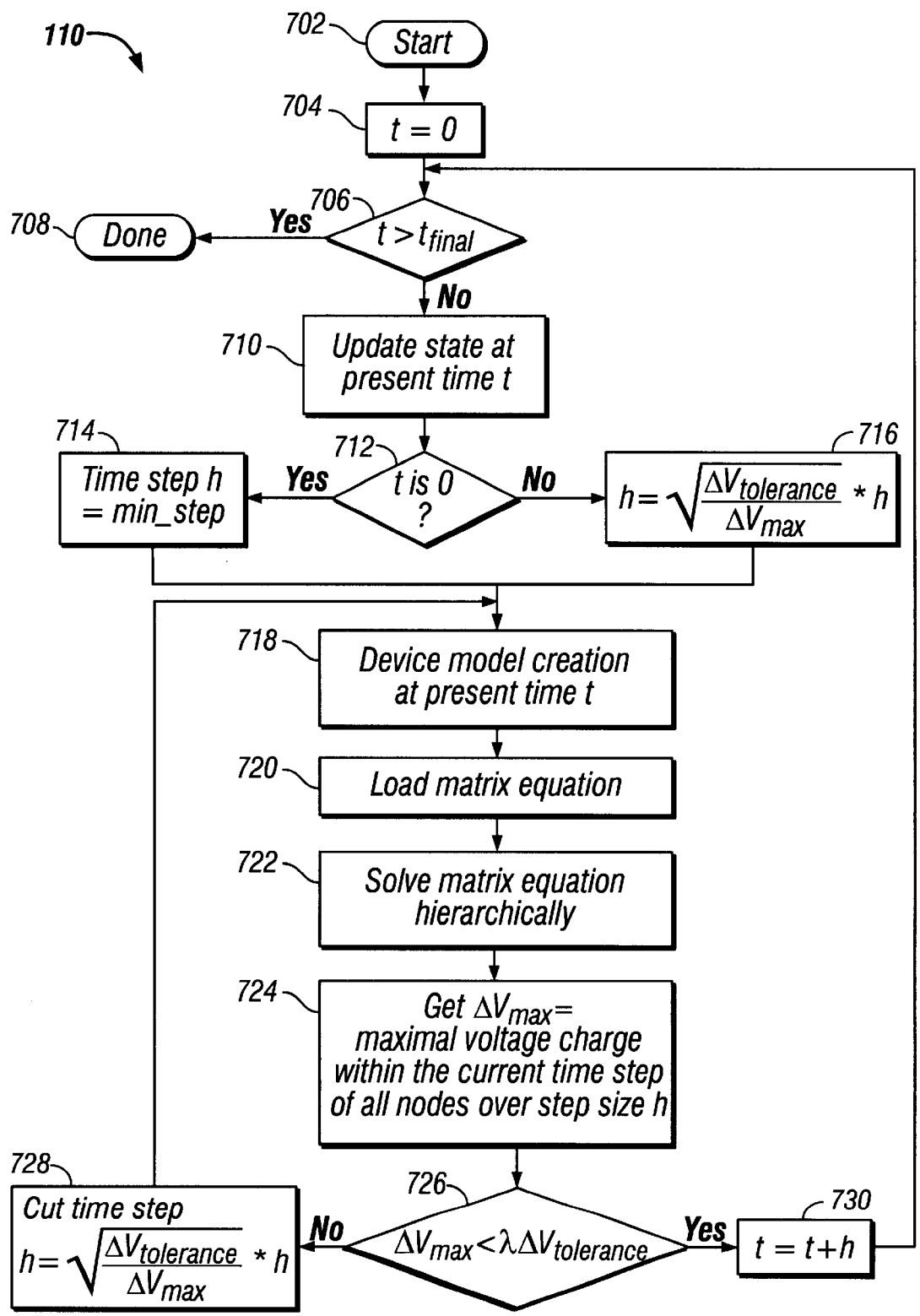
FIG. 8 is a flow diagram illustrating a method of performing transient simulation as shown at block 110 of FIG. 1 according to an embodiment of the invention.

Upon completion of the pre-processing stage at block 106, simulation begins with DC initialization at block 108 which determines the starting state for each node voltage. More particularly, DC initialization is performed to obtain the state at time t=0 and is implemented as a special case of transient simulation. There are three differences between DC initialization and transient simulation as shown in FIG. 8. First, DC initialization starts from zero voltage state at block 710 while transient simulation starts from the final initialized state at the end of DC initialization. Second, each input stimulus source is held at a constant state, equal to the stimulus state value at t=0 throughout the DC initialization process. However, during transient simulation, the stimulus source value will vary with time according to the specified stimulus source definition. Third, DC initialization ends when either the maximal voltage change over one time step is less than a pre-specified tolerance or when the number of time steps exceeds another pre-specified iteration number. However, transient simulation ends when the simulation time reaches the specified final time. The implementation of DC initialization therefore follows the steps described in FIG. 8 except for the three modifications outlined above.

During a conventional simulation of a circuit, the hierarchical simulation netlist is typically flattened to determine the electrical behavior of each subcircuit. Even where the circuit contains equivalent subcircuits, the time-consuming process of determining the behavior of each subcircuit is performed for each individual circuit block. Since these determinations are performed for each circuit block regardless of the existence of an equivalent circuit block, such simulation often requires that duplicate processes be performed. As will be shown and described with a reference to the following figures, according to an embodiment, isomorphism is applied to skip computations for equivalent circuit structures.

Once DC initialization is performed to obtain the state at time t=0, transient simulation may be performed over a period of time. FIG. 8 is a flow diagram illustrating a method of performing transient simulation as shown at block 110 of FIG. 1. The method begins at block 702 at time t=0 as indicated by block 704. Next, at block 706 it is determined whether the expired simulation time is greater than a desired simulation time. If the simulation time at time t is greater than the desired simulation time, the process ends at block 708. Otherwise, the process continues at block 710, where the state is updated at the present time t. One method of performing the state update is presented in FIG. 9.

As described above, isomorphism is applied to skip computations of duplicate subcircuit behavior. If subcircuits are identical topologically and the parameters are the same, the subcircuits are statically identical. By way of example, if the subcircuits include identical structures and circuit parameters (e.g., capacitance, resistance, and transistor size), the subcircuits may share the same static storage. However, during simulation, the dynamic states of the subcircuits may differ. In other words, during simulation, the node voltages may differ. As a result, the matrix computations of neither of the subcircuits may be bypassed during simulation. Only if the voltages are identical may two subcircuits share an identical dynamic voltage state. In this case, the computations of the second equivalent subcircuit may be bypassed. When the state is updated at block 710, the node voltages are determined and associated with the state. The updating process will be described in further detail below with reference to FIG. 9.

During the transient simulation process, the state is updated at various time intervals. However, it may be preferable to update the state more often where there is a greater rate of change in node voltages. Similarly, it may be desirable to update the state less frequently where there is little change in voltage. As a result, the time step may be dynamically adjusted according to the rate of change in node voltages throughout the simulation process. At time t=0, the time step size may be initialized. By way of example, a user may supply a desired time step size. Thus, at block 712, it is determined whether the time is equal to zero. If the time is equal to zero, the time step is initialized to a minimum step size at block 714. By way of example, the time step may be initialized to one pico second ($10^{-12}$ second). However, in subsequent iterations, the new step size h is calculated at block 716 according to the following equation:

$$h = h \times \sqrt{\frac{\Delta V_{tolerance}}{\Delta V_{max}}} \quad (1)$$

where $\Delta v_{tolerance}$=specified tolerance $\Delta v_{max}$=maximum change in voltage of all nodes in the circuit over the time step size h Accordingly, a larger time step may be chosen when the node voltages are slowly changing while a smaller time step may be chosen when the node voltages are rapidly changing.

As shown and described with reference to blocks 718, 720, 722, and 724, all duplicate storage and computations are eliminated. Once the step size has been determined, a device model may be calculated at the present time t for each subcircuit instance based on the updated dynamic voltage state at block 718. The device model calculation result is then stored in association with the corresponding element of the subcircuit instance. More particularly, the device model calculation result may be associated with the corresponding subcircuit definition and updated dynamic voltage state. By way of example, the device model may be a resistance for a resistor element, a capacitance for a capacitor element, or a SPICE model, which generally is provided by the semiconductor vendor, for the MOS transistor. The traditional simulation technology uses a flat approach which requires a device model calculation for each element in the circuit. The flat approach not only consumes a large amount of memory but also requires more computation time. This is particularly important since the device model calculation is performed repetitively for each time step. In contrast, the present invention skips the device model calculation for subcircuit instances having an equivalent subcircuit definition and dynamic state. As described above, if two subcircuits are statically identical, they may share the same subcircuit storage. In addition, two subcircuits may also share the same voltage state at the present time t. Where two subcircuit instances share the same static subcircuit storage and dynamic state, the two subcircuit instances will share the same subcircuit block matrix. As a result, isomorphism may be applied to skip the device model calculation for the equivalent subcircuit. The device model calculation will be described in further detail with reference to FIGS. 9 through 11.

Once the device model calculation is completed, the results are loaded into block matrices, such as that illustrated in FIG. 2B, at block 720. The matrix equation for the subcircuit S is loaded, and this process is performed recursively for each instance X of S. The recursive nature of an operation is indicated in the figures by the symbol "*". An example of the matrix equation is shown and described above with reference to FIG. 2B. One method of loading the subcircuit block matrix is described in further detail below with reference to FIG. 12.

Once the matrix equation is loaded for each subcircuit instance, the matrix equation may be solved hierarchically for each subcircuit instance at block 722. As described above, since the subcircuit block matrix is the same for each subcircuit instance sharing the same subcircuit definition (e.g., static subcircuit storage) and dynamic state, only one matrix solution is required to obtain the node voltages for each of the subcircuit instances. Thus, isomorphism is applied to skip the computations for the remaining subcircuit instances. The matrix equation may be solved using a hierarchical matrix solver such as that described below with reference to FIG. 17.

Upon completion of the matrix solution at block 722 which obtains the new node voltage solution over the current time step, the maximum change for all node voltages over this time step may be applied during the present time step to modify the step size where finer granularity is preferred. As shown at block 724, the maximum voltage change within the current time step is obtained. If this change in voltage is determined to be greater than a specified amount at block 726, the time step is cut at block 728. By way of example, if the change in voltage is determined to be greater than a pre-specified multiple $\lambda$ times another pre-specified tolerance $\Delta v_{tolerance}$, then the step size is reduced according to equation at block 728. According to one embodiment, $\lambda$ may pre-specified and chosen to be 1.5. The process continues at block 718 until the change in voltage is within a specified amount (e.g., $\lambda \Delta v_{tolerance}$). Thus, as the slope of the voltage vs. time curve increases, the time step decreases. Similarly, as the slope of the voltage vs. time curve decreases, the time step may be increased. In this manner, accuracy and speed are balanced to obtain an accurate circuit simulation.

When it is determined at block 726 that the change in voltage is within the specified amount (e.g., $\lambda \Delta v_{tolerance}$), the matrix solution over the current time step is accepted, and the simulation time will proceed to the next time step. As shown at block 730, the subsequent simulation time is determined by adding the time step h to the current time. The transient simulation process then continues at block 706 until the current time exceeds the desired final simulation time. In this manner, the circuit behavior is simulated over a period of time.

As described above, the dynamic voltage state associated with each subcircuit is updated. More particularly, a circuit may contain multiple instances of the same subcircuit. By way of example, an inverter may be used multiple times within the circuit S. While such a circuit block may be identical for multiple instances, the dynamic voltage state associated with each instance may vary. As a result, the state is updated for each of these subcircuit instances $X_i$. However, where the state of a subcircuit instance $X_i$ is identical to that of another subcircuit instance $X_j$ and therefore identical to a state associated with the subcircuit $S_i$, this dynamic storage may be shared. By way of example, a pointer may be used to associate the state of one subcircuit instance with a possible state of the subcircuit $S_i$. According to one embodiment, only the current dynamic voltage state at the present time t is stored. However, the dynamic voltage states may similarly be stored over the duration of the circuit simulation.

Figure 9:
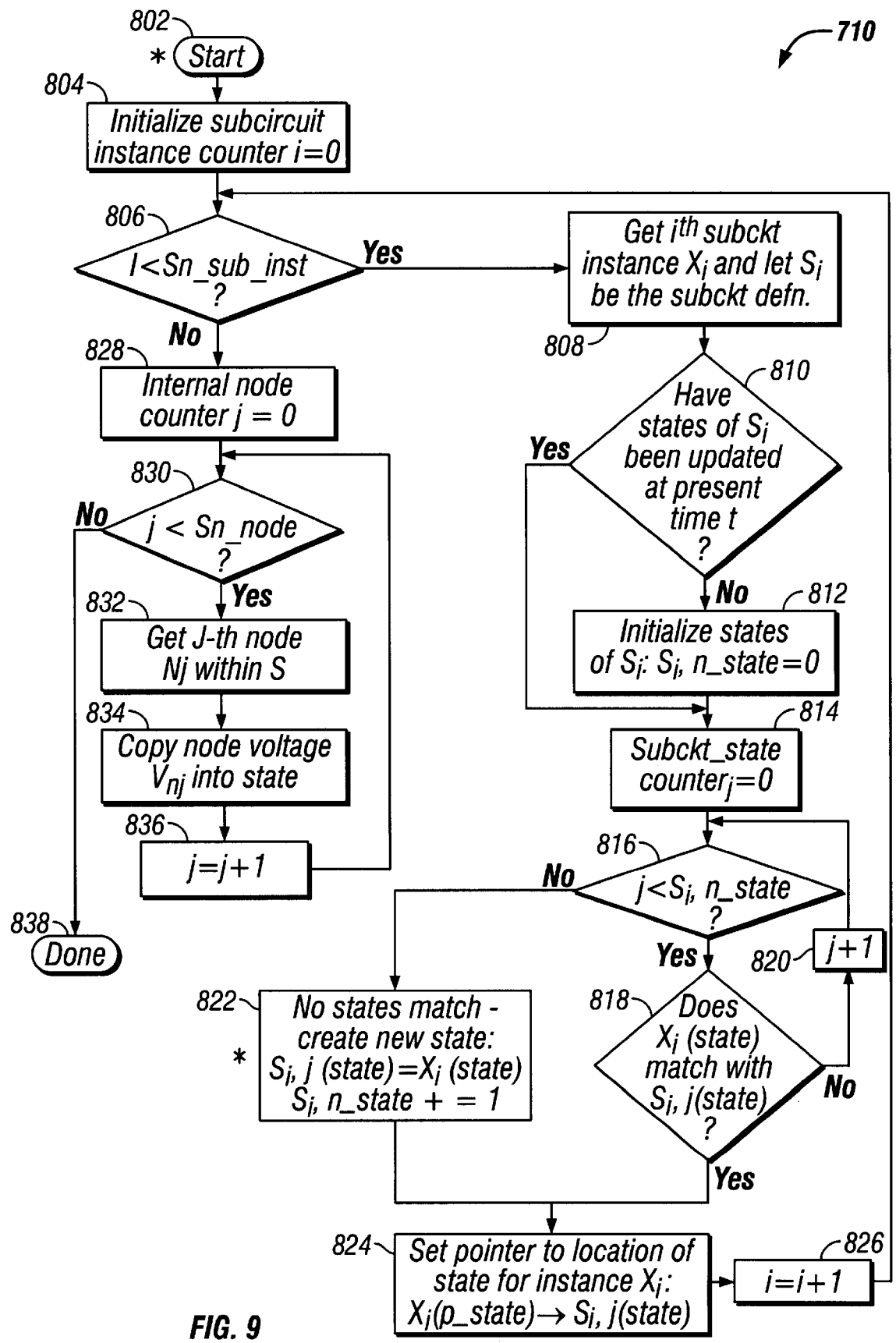
FIG. 9 is a flow diagram illustrating one method of updating the state as shown at block 710 of FIG. 8 according to an embodiment of the invention.

One method of updating the state as shown at block 710 of FIG. 8 according to an embodiment of the invention is illustrated in FIG. 9. The state updating process begins at the top level of the hierarchical data structure and the state of each child subcircuit instance is updated. However, since the process is recursive, it is sufficient to describe the process of updating the state for a single subcircuit instance. The state update process for a subcircuit instance X with subcircuit definition S begins at block 802 and at block 804 a subcircuit instance counter i is initialized. As shown, the subcircuit instance counter i may be initialized to zero. The number of subcircuit instances associated with the subcircuit definition $S_{n\_sub\_inst}$, may easily be determined in preprocessing during generation of the hierarchical data structure. Thus, the state may be updated for each instance at loop 806. As shown, while the subcircuit instance counter i is less than the number of subcircuit instances in the subcircuit, $S_{n\_sub\_inst}$, the process continues. Next, at block 808, the ith subcircuit instance $X_i$ is identified where $S_i$ designates the corresponding subcircuit definition.

As described above, a set of possible states may be associated with the subcircuit definition $S_i$. For each subcircuit instance $X_i$, a pointer or other data structure may be used to indicate the selected state in the set of possible states. More particularly, the state indicates the voltages at nodes in the subcircuit at time t. As a result, storage may be allocated for all possible dynamic voltage states of each subcircuit definition at the current time t while a pointer or other data structure may be assigned to each instance sharing these data structures. In this manner, repetitive storage and computations may be eliminated through the use of pointers or other data structures for instances sharing the same subcircuit storage and dynamic state. Accordingly, where two subcircuit instances share a single dynamic voltage state, memory storage may be minimized.

Once the subcircuit instance is identified, the state may be updated as necessary. Moreover, as indicated above, pointers may link states of instances to a set of possible states associated with their corresponding subcircuit definition S. Thus, when the state is updated for one or more subcircuit instances associated with the subcircuit definition S, the set of possible states may include these updated states. Thus, at block 810, it is determined whether any of the states associated with the subcircuit definition $S_i$ have been updated at the current time t. For instance, the state of another subcircuit instance that shares the same subcircuit definition may have been updated earlier. If it is determined at block 810 that none of the states of the subcircuit definition $S_i$ have been updated at the present time t, the states associated with the subcircuit definition $S_i$ may be initialized to zero at block 812. In this manner, the states of $S_i$ obtained during the previous time step may be removed or "reset" where the states of only the current time step are stored.

The state associated with the subcircuit instance $X_i$ may then be updated such that the state is linked to the set of possible states associated with the corresponding subcircuit definition $S_i$. It is therefore determined whether the state of the subcircuit instance is currently specified in the set of possible states. Thus, in order to compare the state with those of other instances as specified in the set of states, a subcircuit state counter, j, is initialized at block 814 to zero as shown. Next, it is determined whether the state of the subcircuit instance matches the state of another subcircuit instance of the subcircuit definition $S_i$. This may be accomplished by comparing the state (e.g., voltages at internal and port nodes of the subcircuit instance $X_i$) of the subcircuit instance with the current set of states of the subcircuit definition $S_i$. Thus, at block 816, it is determined whether the state has been compared to all states stored in the set of states associated with the subcircuit definition $S_i$. As shown, the subcircuit state counter, j, is compared to the number of states, $S_{i, n\_state}$, associated with the subcircuit definition $S_i$. If the subcircuit state counter, j, is less than the number of states, $S_{i, n\_state}$, the state associated with the subcircuit instance is compared with the jth state in the set of states at block 818. If the states match, the state need not be compared with any other states in the set of states. However, if the states do not match, the subcircuit state counter is incremented at block 820.

If it is determined at block 816 that the state has been compared with all states in the set of states, none of the states match. Therefore, a new state needs to be created for the subcircuit instance $X_i$. Thus, a new state is created at block 822. In addition, the number of states associated with the subcircuit definition $S_i$ is incremented by 1. The state associated with the subcircuit instance $X_i$ is then added to the set of states associated with the subcircuit definition $S_i$. More particularly, the state update of $X_i$ follows the same steps of FIG. 9 and therefore is implemented by recursively calling the procedure of FIG. 9 at block 822. In this manner, a new state is created for all child instances of $X_i$.

As described above, the state of the current subcircuit instance $X_i$ is compared with the states associated with the subcircuit definition $S_i$. If there is a match, the state need not be created. However, if there is no match, a new state is created and added to the set of states of the subcircuit definition $S_i$. The state in the set of states is then associated with the current subcircuit instance $X_i$ at block 824. By way of example, a pointer for the subcircuit instance $X_i$ may be set to point to the location of the state in the set of states for the subcircuit definition $S_i$. The subcircuit instance counter, i, is then incremented at block 826 and the process is repeated for each subcircuit instance.

Once the state has been updated for each child instance $X_i$ of the current subcircuit S, the state is updated for all subcircuit nodes of S such as those associated with primitive elements within the subcircuit S. As described above, the term "subcircuit node" is defined as follows. A subcircuit node may not be a port of the current subcircuit or a node within a child subcircuit. However, a port of a child subcircuit is a subcircuit node for its parent subcircuit unless the port is connected directly to a port of the parent. Thus, a subcircuit node may be associated with a primitive element inside the subcircuit and outside all child subcircuits. Alternatively, a subcircuit node may be a port of a child subcircuit that is not directly connected to a port of the parent subcircuit.

The states of the subcircuit nodes in the subcircuit S may be updated according to the following process. A subcircuit node counter, j, is initialized to zero at block 828. At block 830, if the subcircuit node counter, j, is less than the number of subcircuit nodes, $S_{n\_node}$, associated with the subcircuit S, the jth subcircuit node $N_j$ within the subcircuit is obtained at block 832 from the subcircuit definition. The node voltage associated with the jth subcircuit node $N_j$ is then copied into the state of the subcircuit instance X at block 834. The subcircuit node counter is incremented at block 836 and the process continues until it is determined at block 830 that the state has been updated for all subcircuit nodes of S. The process ends at block 838. Since each port node of S will be updated as a subcircuit node of the parent subcircuit of S, the states need not be independently updated for the port nodes of the S.

Figure 10:
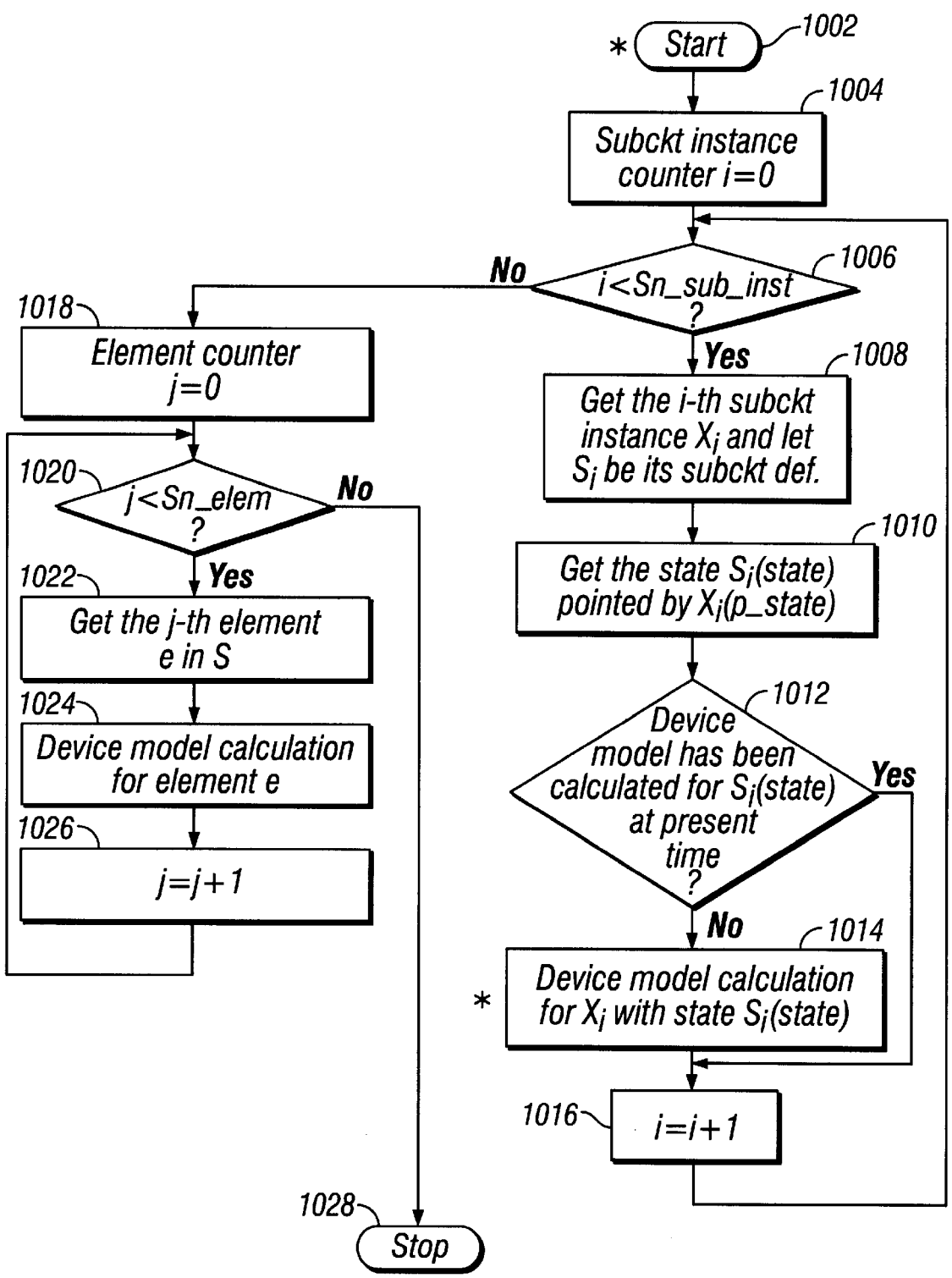
FIG. 10 is a flow diagram illustrating a method of performing a device model calculation for a subcircuit instance X as shown at block 718 of FIG. 8 according to an embodiment of the invention.

After the state is updated, the transient simulation process continues at a subsequent simulation time t. FIG. 10 is a flow diagram illustrating a method of performing a device model calculation as shown at block 718 of FIG. 8 according to an embodiment of the invention. More particularly, a device model calculation is performed for each device in subcircuit instance $X_i$ having a corresponding subcircuit definition $S_i$ as well as the dynamic voltage state previously updated at block 710 of FIG. 8. The process begins at the top level of the hierarchical data structure and may be performed recursively until the device model calculation is performed for all subcircuit instances in the circuit. The process begins at block 1002 and at block 1004 a subcircuit instance counter i is initialized to zero. At block 1006, the subcircuit instance counter i is compared with the number of subcircuit instances in the subcircuit, $S_{n\_sub\_inst}$. If the subcircuit instance counter i is less than the number of subcircuit instances, $S_{n\_sub\_inst}$, device model calculations may be performed for the remaining subcircuit instances at blocks 1008 through 1016. The i-th subcircuit instance $X_i$ is identified at block 1008 where $S_i$ represents the corresponding subcircuit definition. The state of the subcircuit instance $X_i$ is then obtained at block 1010. That is, a state associated with the subcircuit definition $S_i$, $S_i$(state), may be obtained through a pointer associated with the subcircuit instance $X_i$.

Once the state is obtained, it is determined at block 1012 whether the device model calculation has been performed for the subcircuit $S_i$ with the obtained state $S_i$(state) at the current time t. If the device model calculation has not been performed for the obtained state, a device model calculation is performed for the subcircuit instance $X_i$ with the obtained state $S_i$(state) at block 1014. If necessary, device model calculations for the children of the current subcircuit instance $X_i$ are performed recursively according to process of FIG. 10 all the way down to the lowest level of the hierarchy. In this manner, the device model calculation may be performed for all the lowest-level descendants under $X_i$. However, if it is determined at block 1012 that the device model calculation has been performed for the obtained state, the device model calculation for instance $X_i$ need not be created. In other words, the device model calculation has been performed earlier for another subcircuit with the same subcircuit definition and dynamic voltage state at the present time t. Accordingly, isomorphism is applied to skip the device model calculation for the equivalent subcircuit and state. The subcircuit instance counter i is incremented at block 1016 and the process continues at block 1006 for all remaining subcircuit instances.

After the device model calculation has been performed for each subcircuit instance of S, the device model calculation is performed for each primitive element in S. In other words, the process of FIG. 10 may be called recursively for each subcircuit instance such that the device model calculation is performed for the primitive elements in each of the subcircuit instances. An element counter j is initialized to zero at block 1018. At block 1020, if the element counter j is less than the number of elements in the current subcircuit, $S_{n\_elem}$, the jth primitive element e of the current subcircuit is obtained at block 1022 from the subcircuit definition. More particularly, as described above, the information may be provided in an element definition associated with the element. The device model calculation may then be performed for the obtained element at block 1024. A method of performing the device model calculation for a primitive element within a subcircuit according to an embodiment of the invention is described with reference to FIG. 11. The element counter j is then incremented at block 1026, and the process repeats until it is determined at block 1018 that a device model calculation has been performed for all elements in the current subcircuit definition. The process ends at block 1028.

Figure 11:
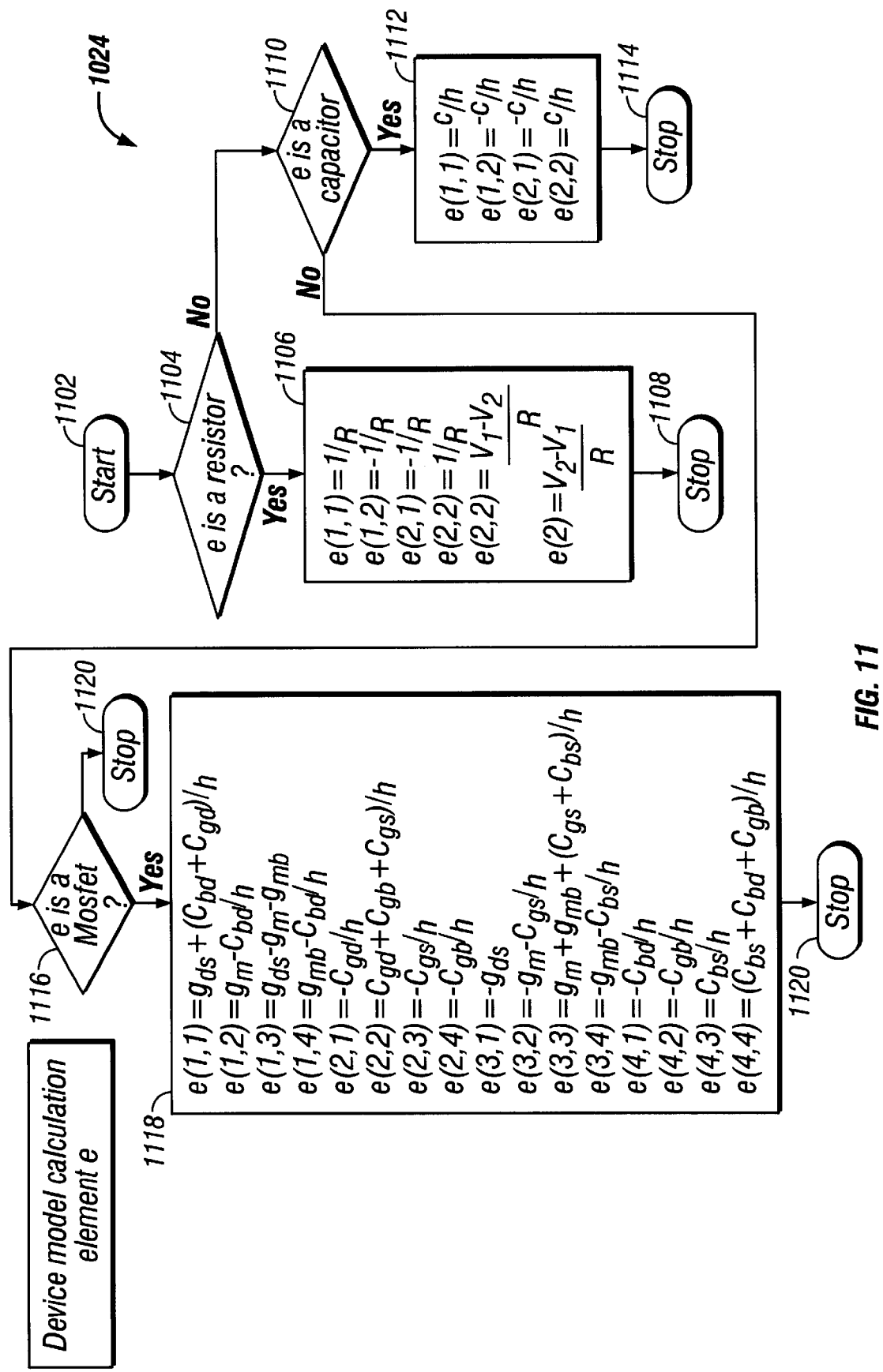
FIG. 11 is a flow diagram illustrating one method of doing a device model calculation for an element as shown at block 1024 of FIG. 10 according to an embodiment of the invention.

As described above, for each subcircuit instance, a device model specifying the behavior of each primitive element is calculated as necessary. More particularly, the behavior of each element (e.g., current) may be described by a set of equations in which parameter values (e.g., resistance, capacitance, transistor parameters) are specified. By way of example, as shown in FIG. 11, each set of equations may be provided in a multi-dimensional array corresponding to the element definition or subcircuit definition. FIG. 11 is a flow diagram illustrating one method of calculating a device model for a primitive element within a subcircuit as shown at block 1024 of FIG. 10. As will be described, the device model may be calculated using the associated set of equations, the updated state, and information provided in the corresponding element or subcircuit definition such as the number of terminals in the primitive element. The process begins at block 1102 and at block 1104 it is determined whether the element is a resistor. If the element is a resistor, the behavior of the element, described by resistance and the current flowing through the resistor, is created and stored in association with the element at block 1106. More particularly, the behavior of the resistor having a specified resistance parameter value and a corresponding dynamic voltage state may be described in the form of a matrix equation and solved. The process ends at block 1108. If the element is not a resistor and it is determined at block 1110 that the element is a capacitor, a device model for the capacitor is created at block 1112. By way of example, the behavior of the capacitor may be described by the capacitance and the time step h at the current time, then stored in association with the element. The process ends at block 1114. If the element is not a capacitor, it is determined at block 1116 whether the element is a transistor. If the element is a transistor, a device model is created at block 1118 describing the behavior of the transistor. By way of example, if the element is a MOS transistor, the behavior of the element may be described by the transistor current, the transistor conductances, and the transistor capacitances evaluated at the present time t with transistor terminal voltages obtained from the dynamic state of the subcircuit containing the transistor. The process ends at block 1120. The above process is merely illustrative, and a device model may be created and calculated for any element through various mechanisms, including, but not limited to, the use of a matrix equation.

Once the device model calculation has been completed for each element of every subcircuit instance, the matrix equation may be loaded the device model values for each child subcircuit instance of the circuit. One method of loading the matrix equation as shown in block 720 of FIG. 8 is described in further detail with reference to FIG. 12. An exemplary matrix equation describing the behavior of a subcircuit S is shown and described with reference to FIG. 2B, where $Wv=i$. Similarly, each sub-matrix $W_i$ describes the behavior of the i-th subcircuit instance $X_i$ of S where $W_i v_i = i_i$. Moreover, $W_i$ may have the same block structure as W if $W_i$ also has its own child instances. The matrix equation of X is loaded by filling in the value of each enry in matrices A, C, D, G and vectors $i_b$ and $i_c$.

The process begins at block 1202 and a subcircuit instance counter i is initialized to zero at block 1204. Next, it is determined, at block 1206, whether the value of i is less than $S_{n\_sub\_inst}$, the number of subcircuit instances in S. If the value of i is determined to be less than the number of subcircuit instances in S, the i-th instance $X_i$ is obtained at block 1208 where $S_i$ designates its subcircuit definition. Temporary matrices M, N, and vector f of dimensions mxn, nxm, and n respectively are also initialized to zero, where m is the number of internal nodes in $S_i$, and n is the number of subcircuit nodes of S. The state of $X_i$ may then be obtained from the set of dynamic states associated with the corresponding subcircuit definition $S_i$ through the use of a pointer at block 1210. In this manner, the state of $X_i$, denoted as $S_i$(state), may be obtained.

At block 1212, it is determined whether the matrix equations, $W_i v_i = i_i$, of the subcircuit $S_i$ with state $S_i$(state) have been loaded. If the matrix equations have been loaded, the matrices $A_i$, $C_i$, $D_i$, $G_i$, and the vectors $i_{bi}$, and $i_{ci}$, may be obtained from the earlier data at block 1214, as a result of loading matrix equations for $S_i$ with state $S_i$(state). In addition, the port coupling matrices $C_{Pi}$, $D_{Pi}$, and the port injection current vector $i_{pi}$ associated with $S_i$(state) are also obtained. $C_{Pi}$ represents the coupling from port nodes of $S_i$ to internal nodes of $S_i$, and $D_{Pi}$ represents the opposite coupling from internal nodes of $S_i$ to port nodes of $S_i$. The injection current vector $i_{pi}$ represents the injection currents from internal nodes of $S_i$ to the port nodes of $S_i$.

Figure 12A:
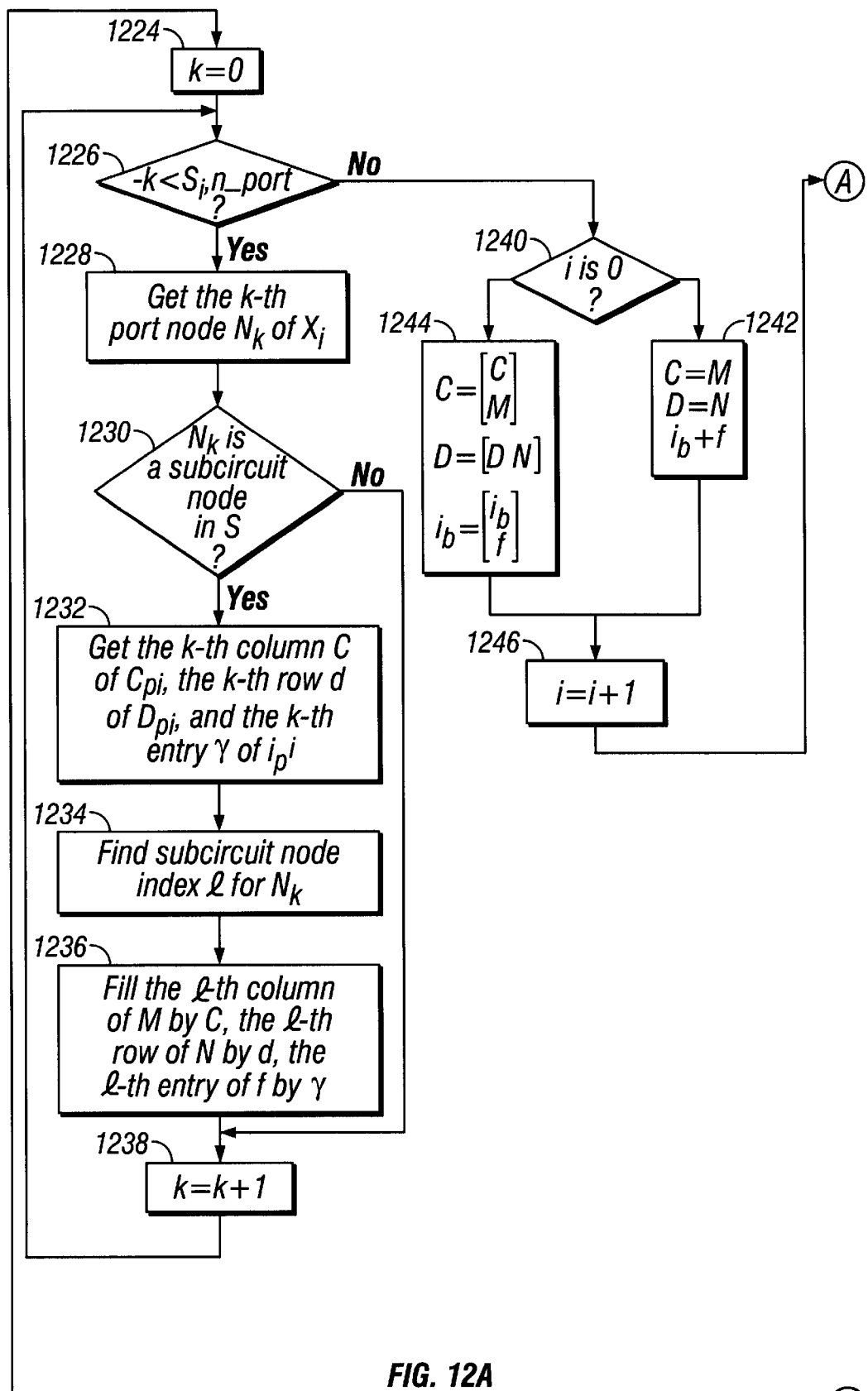
FIG. 12 is a flow diagram illustrating one method of loading the matrix equation as shown at block 720 of FIG. 8 according to an embodiment of the invention.
Figure 12B:
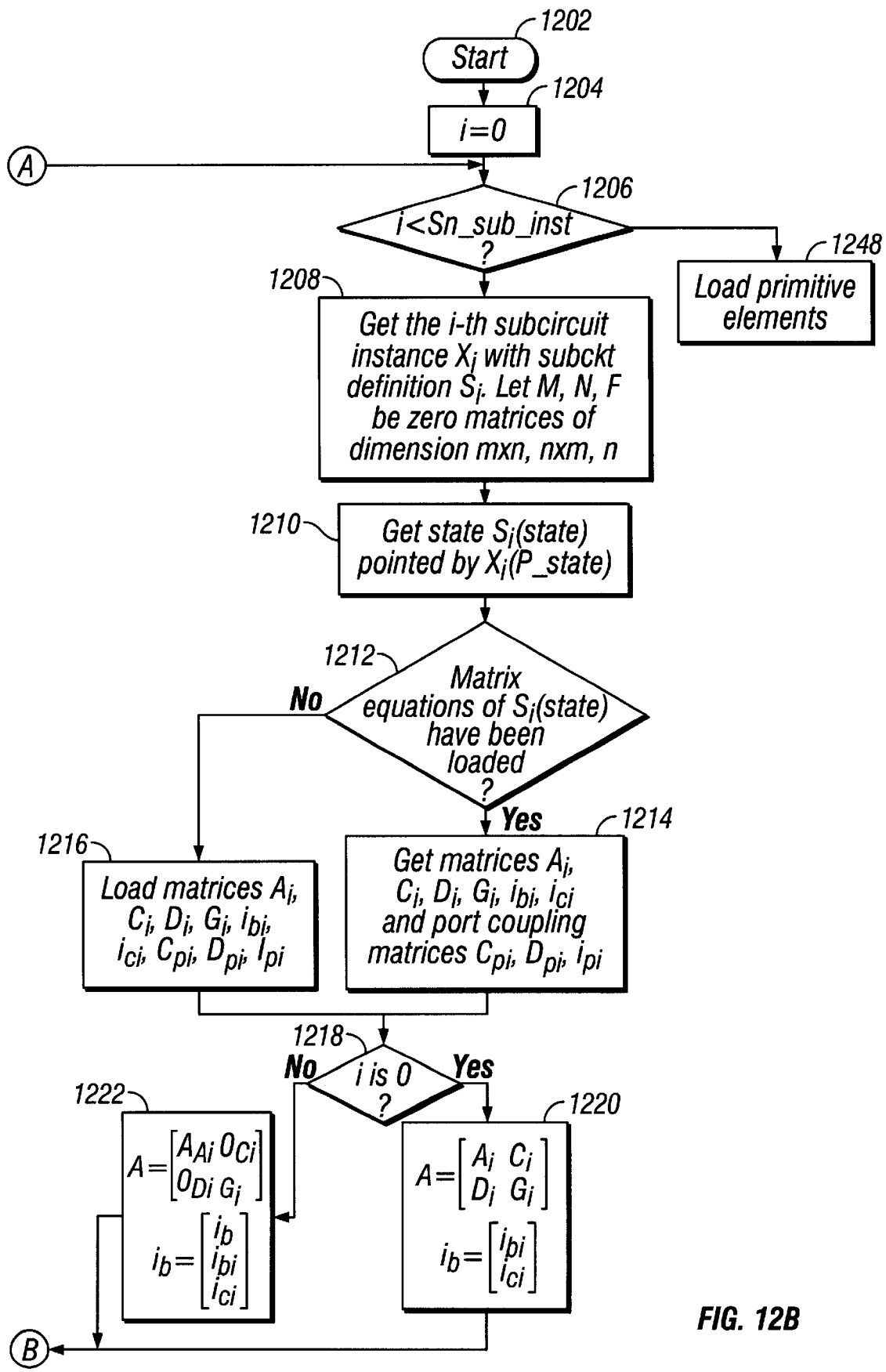

If the matrix equations have not been loaded for the subcircuit definition $S_i$ with state $S_i$(state), then the matrices are loaded at block 1216. The loading of matrices $A_i$, $C_i$, $D_i$, $G_i$, and the vectors $i_{bi}$, and $i_{ci}$ at block 1216 is performed recursively for all children of the current subcircuit instance. The procedure is the same as its parent process as shown in FIG. 12, except the target is to load the matrix equations for child instance $X_i$ with state $S_i$(state). The loading of $C_{Pi}$, $D_{Pi}$, and $i_{pi}$ is described in further detail below with reference to FIGS. 14 through 16. The process then continues at block 1218.

After the matrix equations for the i-th subcircuit instance $X_i$ have been loaded or obtained from the earlier data, the entry values of matrices $A_i$, $C_i$, $D_i$, $G_i$, are filled into the i-th diagonal block location of matrix A, and the vectors $i_{bi}$ and $i_{ic}$ are loaded into the corresponding location of the vector $i_b$, as shown at block 1220 when the value i is zero, or at block 1222 when i is nonzero.

In addition, for the current instance X, the coupling matrices C and D and current vector $i_b$ are loaded to form updated coupling matrices C and D as well as an updated current vector $i_b$. This is accomplished through applying the port coupling matrices $C_{Pi}$, $D_{Pi}$, and the port injection current $i_{pi}$, obtained at block 1214 or loaded at block 1216. A port counter k is initialized to zero at block 1224. It is then determined at block 1226 whether the value of k is less than $S_{i,n\_port}$, the number of ports in $S_i$. If the value of k is less than the number of ports in $S_i$, the k-th port node of $S_i$ is identified to be $N_k$ at block 1228. At block 1230, it is then determined whether node $N_k$ is a subcircuit node of S. If it is determined that the node is a subcircuit node, the k-th column of $C_{Pi}$ is extracted and denoted as c, the k-th row of $D_{Pi}$ is extracted and denoted as d, and the k-th entry of the vector $i_{pi}$ is identified to be r, as shown at block 1232. Vectors c and d define the couplings between internal nodes of $S_i$ and $N_k$, the k-th port node of $S_i$. Thus, the value of r defines the current injected from internal nodes of $S_i$ into node $N_k$. The index number for node $N_k$ is identified to be l at block 1234. In other words, node $N_k$ is the l-th subcircuit node in subcircuit S. At block 1236, the l-th column of the temporary matrix M is filled by the column vector c; the l-th row of N is filled by the row vector d; and the l-th entry of the vector f is filled by the value of r. If it is determined at block 1230 that node $N_k$ is not a subcircuit node of S, blocks 1232–1236 are skipped and the process continues at block 1238. At block 1238, the port counter k is incremented and the process continues at block 1226 until the matrices M, N and the vector f are filled for each port node of $S_i$.

Once the temporary matrices M, N and the vector f are filled, they are concatenated to form updated coupling matrices C and D as well as an updated current vector $i_b$. At block 1240, if the instance counter i is zero, C and D are created for the first time. As a result, at block 1242, C and D are directly copied from M and N, respectively. If it is determined at block 1240 that the instance counter i is not zero, then M and N are concatenated to the existing matrices C and D, respectively, to obtain new coupling matrices C, D and vector $i_b$ as shown at block 1244. In either case, the vector f is concatenated to the existing vector $i_b$, obtained at block 1220 or 1222, to form the updated vector $i_b$. These new matrices C, D and vector $i_b$ will thus contain couplings and injection currents from subcircuit instance $X_i$, as well as other instances $X_j$, for j=0, 1, 2, i–1. The subcircuit instance counter i is incremented at block 1246 and the process returns to block 1206 to determine whether i is still less than the number of subcircuit instances $S_{n\_sub\_inst}$.

When the instance counter i is no less than $S_{n\_sub\_inst}$ such that the matrix equations for each subcircuit instance of S have been loaded, the matrices A, C, and D and the vector $i_b$ are fully loaded. At block 1248, the process continues to load the matrix G and the vector $i_c$.

Figure 13:
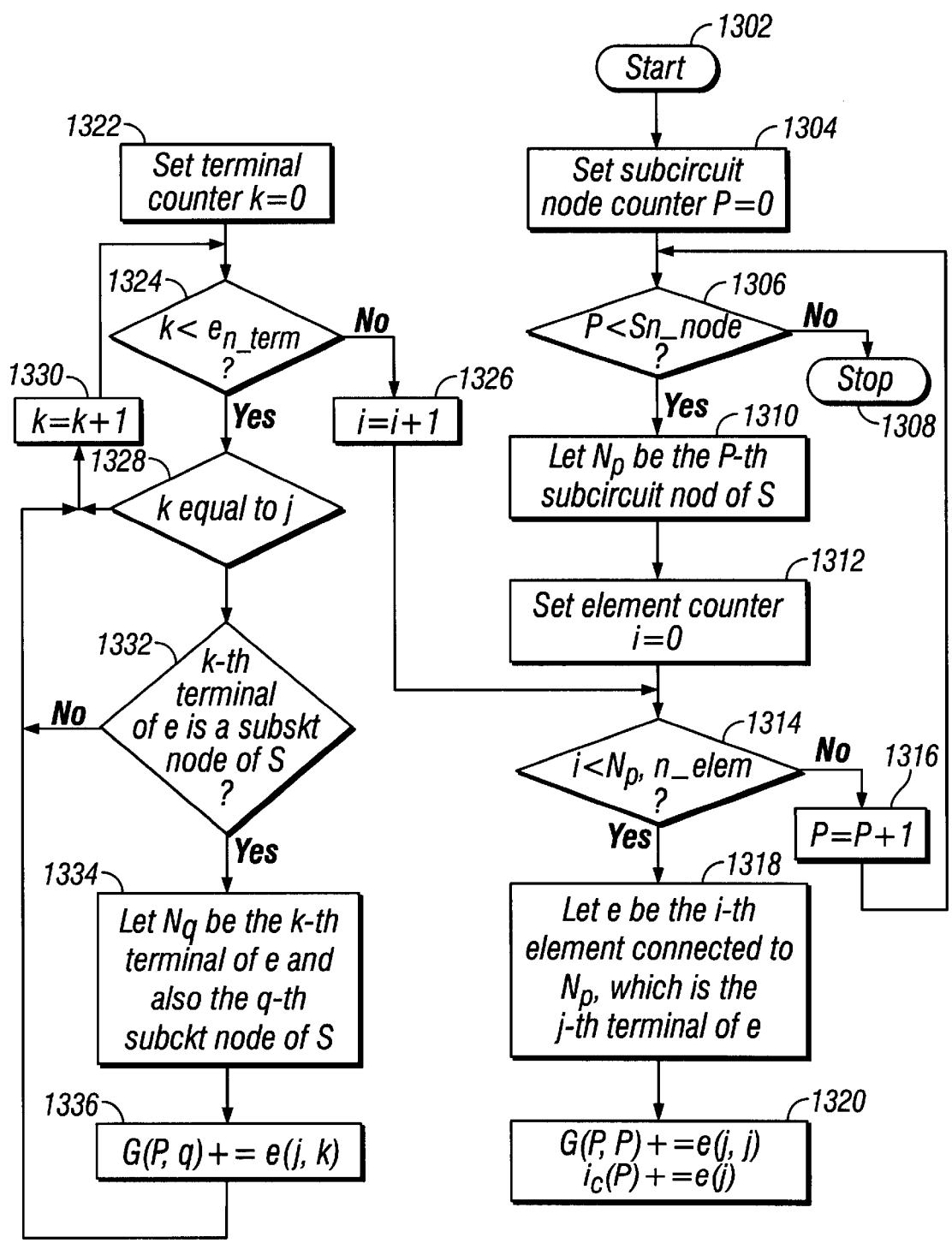
FIG. 13 is a flow diagram illustrating one method of updating the admittance matrix G and the current vector $i_c$ as shown at block 1248 of FIG. 12 according to an embodiment of the invention.

One method of loading the G matrix and the vector $i_c$ is shown in FIG. 13. The process begins at block 1302. A subcircuit node counter p is initialized to zero at block 1304, and p is compared with $S_{n\_node}$, the number of subcircuit nodes in subcircuit S at block 1306. If the value of p is less than $S_{n\_node}$, the p-th subcircuit node N is obtained at block 1310. Otherwise, the process terminated at block 1308.

The following steps go through elements connected to $N_p$ in two nested loops. The first loop uses the counter i to load the conductance and current from the i-th element connected to $N_p$ into the p-th diagonal entry of the matrix G, and the p-th entry of the vector i, respectively. The second loop is within the first loop and uses the counter k to load the coupling conductance from the k-th terminal (of the i-th element connected to $N_p$) into the off-diagonal entry to matrix G.

In the first loop, an element counter i is initialized to zero at block 1312. The value of i is then compared with $N_{p,n\_elem}$, the number of elements connected to node $N_p$, at block 1314. If the value of i is not less than $N_{p,n\_elem}$, the subcircuit node counter p is incremented at block 1316 and the process continues for the remaining subcircuit nodes in S. While i is less than $N_{p,n\_elem}$, the i-th element e connected to $N_p$ is obtained, where $N_p$ is the j-th terminal of element e at block 1318. At block 1320, the equivalent conductance e(j,j) at the j-th terminal of element e, which is obtained from the device model calculation at block 718, is added into the p-th diagonal entry of matrix G at block 1320. In addition, the injected current e(j) from the j-th terminal of element e is added into the p-th entry of vector $i_c$.

The second loop begins at block 1322 when an element terminal counter k is initialized to zero. It is determined whether the value of k is less than $e_{n\_term}$, the number of terminals in the element e, at block 1324. If the value of k is not less than $e_{n\_term}$, then the second loop terminates and continues at block 1326 to increment the index value i of the first loop. Otherwise, it is determined, at block 1328, whether the second loop index value of k is equal to the value j. If k is equal to j, then there is no need to load the coupling conductance between the k-th terminal of e and the j-th terminal of e, since both terminals are referring to the same node. Under this condition, it proceeds to block 1330 to increment the value of k. If k is not equal to j, then it is determined whether the k-th terminal of element e is a subcircuit node of subcircuit S, as shown at block 1332. If it is determined at block 1332 that the k-th terminal is not a subcircuit node of S, then the process returns to block 1330 to increment the value of k. However, if the k-th terminal of element e is determined at block 1332 to be a subcircuit node of S, then it is determined at block 1334 to be the q-th subcircuit node $N_q$. The coupling conductance from the k-th terminal of e to the j-th terminal of e e(j.k), is added into the off-diagonal entry G(p,q), as shown at block 1336.

Figure 14A:
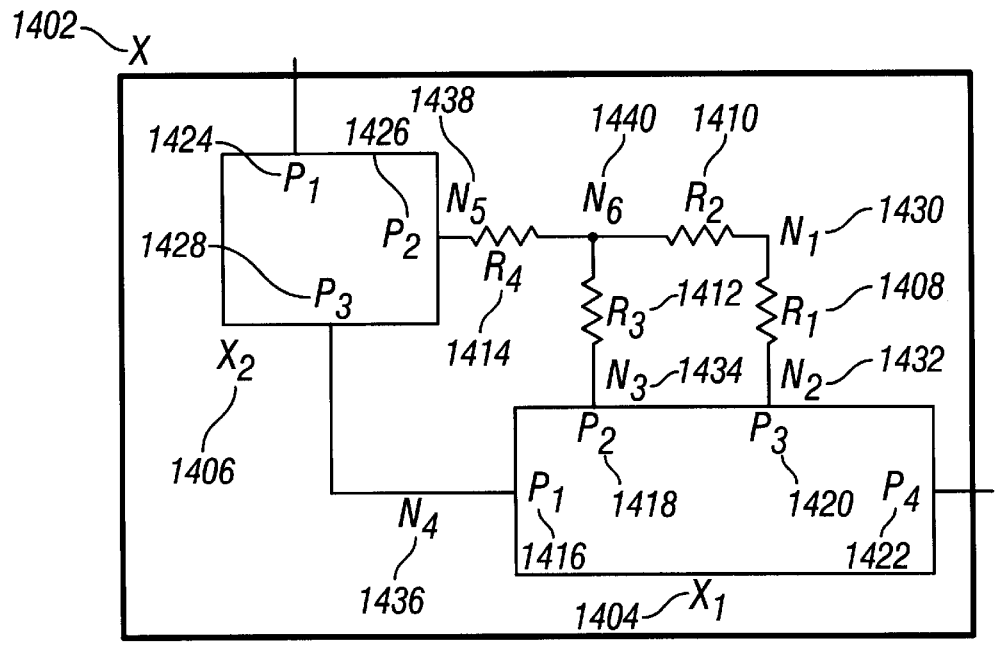
FIG. 14A is an exemplary circuit diagram used to illustrate the creation of coupling matrices from port coupling matrices as shown in FIG. 14B.
Figure 14B:
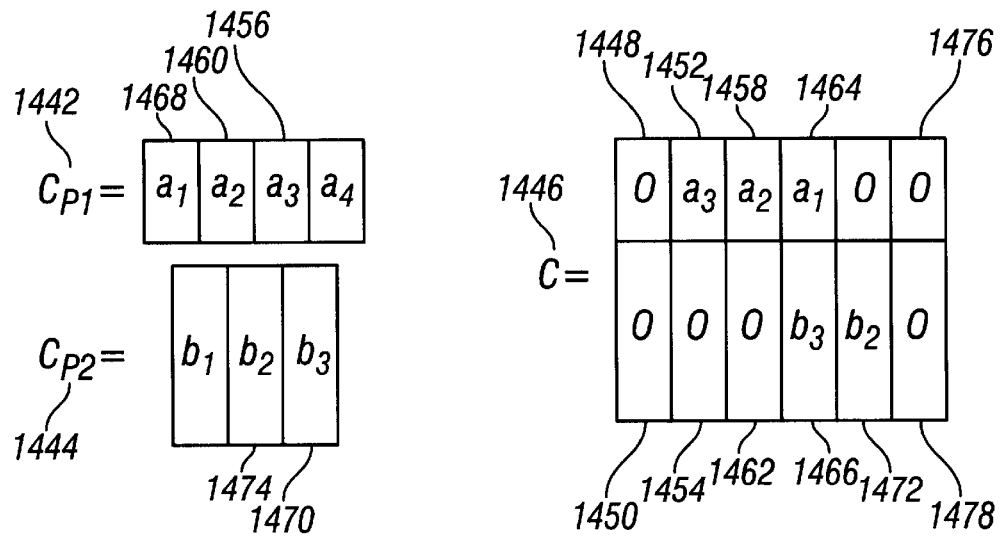
FIG. 14B is an exemplary procedure illustrating the use of the port coupling matrices to create the coupling matrices according to an embodiment of the invention.
Figure 14B:
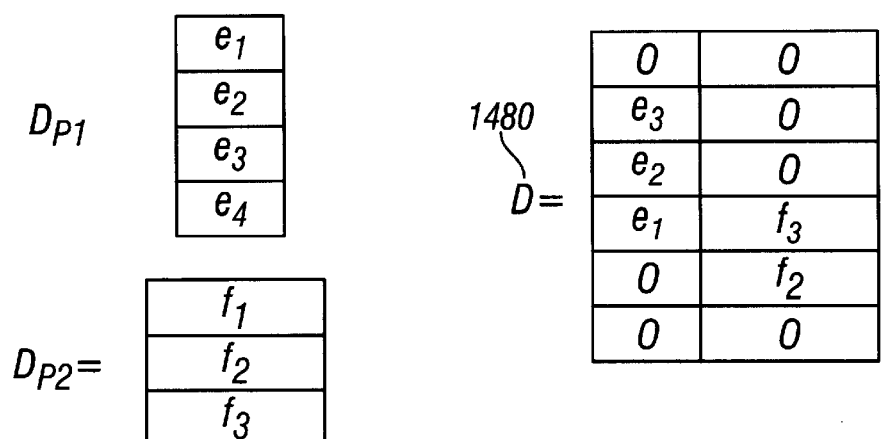
Figure 15:
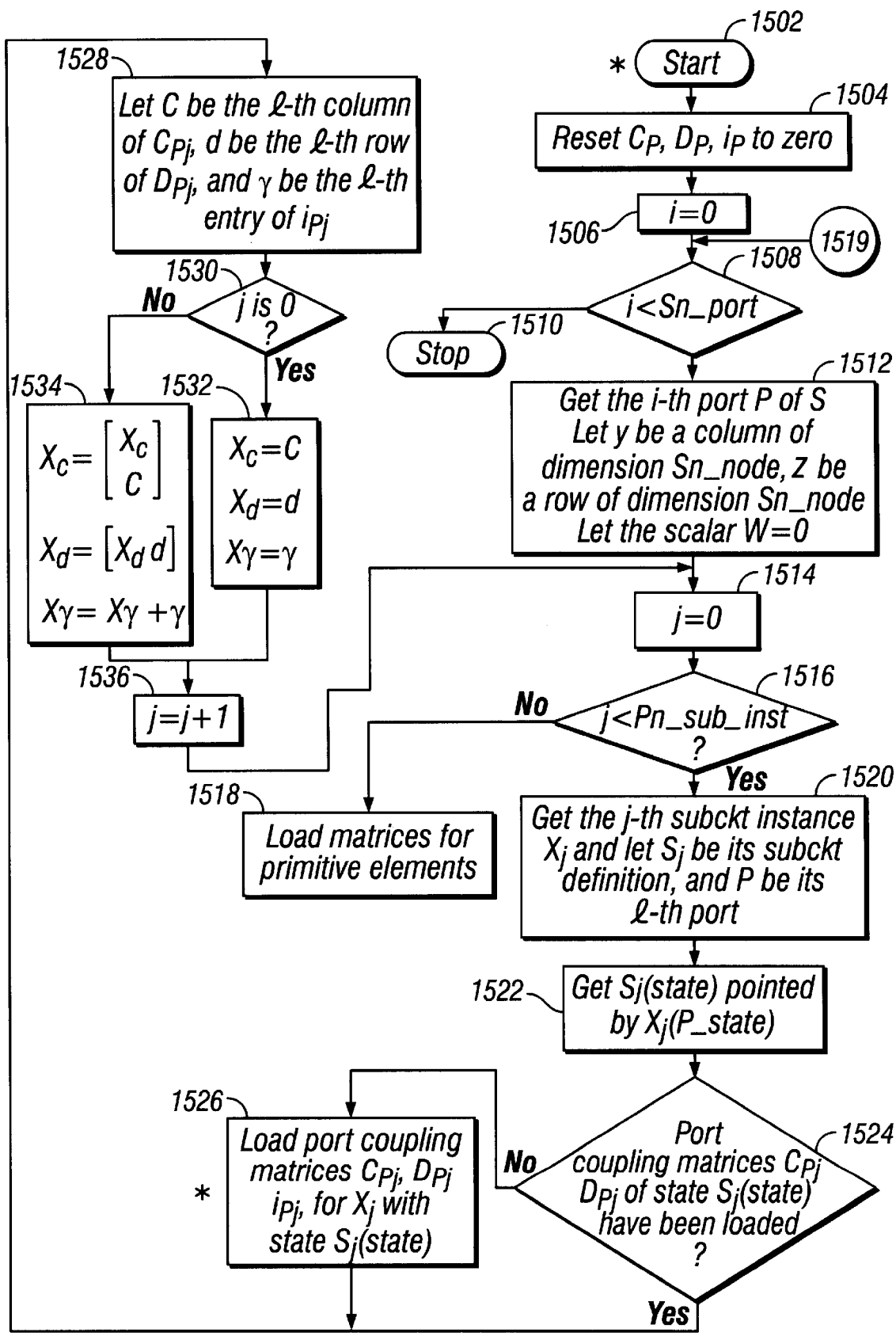
FIG. 15 is a flow diagram illustrating a method of loading the coupling between the ports of the circuit S and the internal nodes of the child instances according to an embodiment of the invention.
Figure 16:
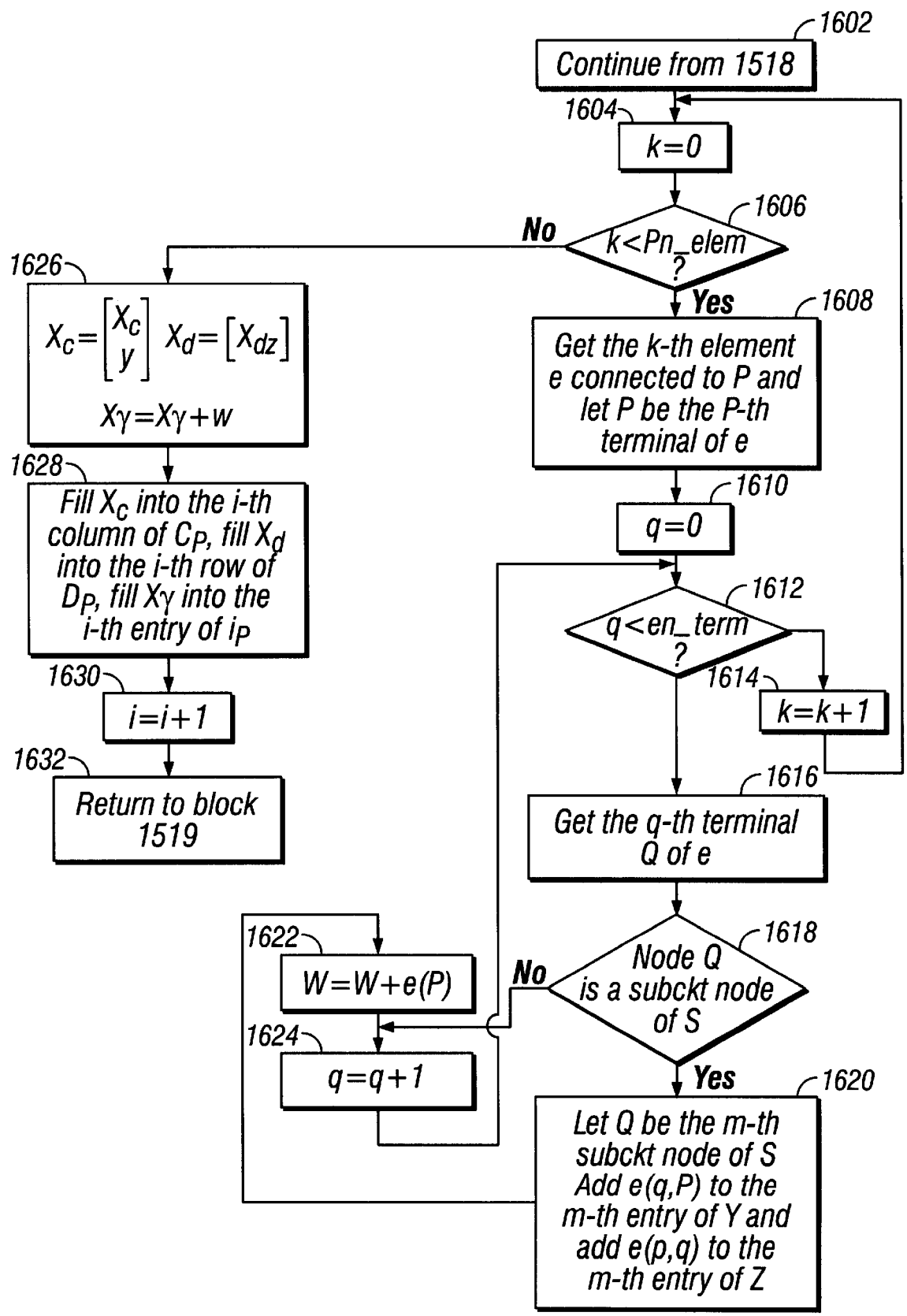
FIG. 16 is a flow diagram illustrating a method of loading the coupling between the ports of the circuit S and the primitive elements of the circuit according to an embodiment of the invention.

The coupling matrices C and D specify the coupling between the subcircuit nodes and internal nodes of the same subcircuit S. As described above with reference to FIG. 12, the appropriate columns/rows of the port coupling matrices, associated with child instances of S, are extracted and concatenated to create the matrices C and D. FIGS. 14A through 14C are provided to illustrate one method of creating the coupling matrices from the port coupling matrices. More particularly, FIG. 14A is an exemplary circuit diagram that will be referred to in the following discussion. As shown, an exemplary subcircuit X 1402 has two subcircuit instances $X_1$ 1404 and $X_2$ 1406, and four primitive elements, R1 1408, R2 1410, R3 1412, and R4 1414. $X_1$ 1404 has four ports $P_1$ 1416, $P_2$ 1418, $P_3$ 1420, and $P_4$ 1422. $X_2$ 1406 has three ports $P_1$ 1424, $P_2$ 1426, and $P_3$ 1428. The fourth port $P_4$ 1422 of $X_1$ 1404 and the first port $P_1$ 1424 of $X_2$ 1406 are also port nodes of S and thus are not subcircuit nodes of S. Subcircuit S contains six subcircuit nodes $N_1$ 1430, $N_2$ 1432, $N_3$ 1434, $N_4$ 1436, $N_5$ 1438, and $N_6$ 1440. Three of the subcircuit nodes, $N_2$ 1432, $N_3$ 1434, and $N_4$ 1436 are also port nodes of $X_1$ 1404 or $X_2$ 1406.

In order to illustrate the creation of the coupling matrices from the port coupling matrices, exemplary port coupling matrices and associated coupling matrices corresponding to the circuit diagram of FIG. 14A are presented in FIG. 14B. The port coupling matrix $C_{P1}$ 1442 of instance $X_1$ 1404 has four columns since $X_1$ 1404 has four port nodes. Similarly, the port coupling matrix $C_{P2}$ 1444 associated with instance $X_2$ 1406 has three columns since $X_2$ 1406 has three port nodes. In this example, the number of rows in $C_{P1}$ 1442 is less than the number of rows in $C_{P2}$ 1444, as shown by the height comparison between $C_{P1}$ 1442 and $C_{P2}$ 1444 in FIG. 14B. This indicates that $X_2$ 1406 has more internal nodes than X1, 1404, since the row number of the port coupling matrix $C_P$ is equal to the internal node number of the corresponding subcircuit instance. The matrix C 1446 is concatenated by selective columns of $C_{P1}$ 1442 and $C_{P2}$ 1444: The first upper column segment 1448 of C 1446 represents the coupling between internal nodes of $X_1$ and the first subcircuit node $N_1$ of S. Since $N_1$ is not a port node of $X_2$, the first upper column segment 1448 of C 1446 is zero. Similarly, since $N_1$ is not a port node of $X_2$, the coupling between internal nodes of $X_2$ and the first subcircuit node $N_i$ of S is zero. The first lower column segment 1450 is therefore also zero. The upper 1452 and lower segments 1454 of the second column of C represents the coupling between $N_2$ and internal nodes of $X_1$ and $X_2$, respectively. The second upper column segment 1452 of C is copied from the third column 1456 of $C_{P1}$ 1442 since node $N_2$ is also the third port node $P_3$ of $X_1$. In addition, the second lower column segment 1454 is zero since $N_2$ is not a port node of $X_2$. The top portion in the third column, or the third upper column segment 1458 of C 1446 is copied from the second column 1460 of $C_{P1}$ 1442 since node $N_3$ is also the second port node of $X_1$. However, the third lower column segment 1462 is zero since node $N_3$ is not a port node of $X_2$. Node $N_4$ is a port node for both $X_1$ and $X_2$. The top 1464 and bottom 1466 portions of the fourth column in C are thus copied from the first column 1468 of $C_{P1}$ and the third column 1470 of $C_{P2}$, respectively. Moreover, node $N_5$ is a port node of only $X_2$ and therefore only the bottom portion 1472 of the fifth column in C is copied from the second column 1474 of $C_{P2}$. The upper 1476 and lower 1478 segments of the sixth column of C is zero since node $N_6$ is not port node of $X_1$ or $X_2$. The D matrix 1480 may be similarly constructed from the port coupling matrices $D_P$ by changing columns to rows.

As described above, loading of the port coupling matrices $C_P$ and $D_P$ for a subcircuit instance is performed at block 1216 of FIG. 12. A flow diagram illustrating one method of filling the port coupling matrices for a subcircuit with a certain dynamic voltage state is presented in FIG. 15. As shown and described with reference to FIGS. 14A and 14B, each column of $C_P$ and each row of $D_P$ represent the coupling between a port node of S and internal nodes of S. The process of loading the port coupling matrices begins at block 1502 and first resets port coupling matrices $C_P$ and $D_P$, and port injection current vector $i_P$ to zero, as shown at block 1504. The process loops through each port node of S to fill in entries of the corresponding column of $C_P$ and corresponding row of $D_P$. Thus, a port node counter i is initialized to zero at block 1506. The value of i is compared with $S_{n\_port}$, the number of port nodes in S, at block 1508. If i is less than the number of port nodes in S, $S_{n\_port}$, then the i-th port node of S, denoted as P, is obtained at block 1512. Let y be a column vector of dimension $S_{n\_port}$, the number of subcircuit nodes in subcircuit S, z be a vector of the same dimension, and w be a scalar, where w is initialized to zero.

The port coupling matrices associated with the i-th port node, P, are loaded as follows. At block 1514, an instance counter j is initialized to zero. The process loops through each instance or element connecting to node P and adds the coupling value, between node P and other terminals of the instances or element, to the $C_P$ column and $D_P$ row corresponding to the port node P. At block 1516, the value j is compared with $P_{n\_sub\_inst}$, the number of child instances of S connected to node P. If j is less than $P_{n\_sub\_inst}$, the j-th instance $X_j$ connected to node P is obtained at block 1520, where $S_j$ designates its subcircuit definition and P is assumed to be the l-th port of $S_j$. The state associated with $X_j$, denoted as $S_j$(state), may then be obtained from the set of states associated with the subcircuit definition $S_j$ at block 1522 through the use of a pointer $X_j$(p_state) or other mechanism. At block 1524, it is determined whether the port coupling matrices $C_{Pj}$ and $D_{Pj}$ and the port injection current vector $i_{Pj}$ associated with the state $S_j$(state) have been loaded earlier. If the port coupling matrices and port injection current vector have previously been loaded, the loading of the port coupling matrices and port injection current vector at block 1526 is skipped. More particularly, the loading of the port coupling matrices and port injection current vector at block 1526 applies the same process of FIG. 15 to recursively load the port coupling matrices and port injection current for each descendant instance of $X_j$.

Once $C_{Pj}$, $D_{Pj}$ and $i_{Pj}$ are obtained, the l-th column of $C_{Pj}$, the l-th row of $D_{Pj}$, and the l-th entry of $i_{Pj}$ are obtained and are denoted as c, d, and r, respectively, at block 1528. It is then determined, at block 1530, whether the value of j is zero. If j is zero, then c, d, and r are directly copied to $x_c$, $x_d$, and $x_r$, respectively, as shown at block 1532. Otherwise, if j is not zero, $x_c$ and $x_d$ are obtained at block 1534 by concatenating their earlier values with c and d, respectively. In addition, the new value of $x_r$ is incremented by the value of r. The instance counter j is incremented at block 1536 and the process continues at block 1516 for the remaining instances connecting to port node P.

If each instance connecting to node P has been processed such that the value of j is not less than $P_{n\_sub\_inst}$ at block 1516, then the process continues at block 1518 to load the coupling, through primitive elements of S connecting to P, into the port coupling matrices. The process starts at block 1602 in FIG. 16 and an element counter k is initialized to zero at block 1604. The value of k is compared with $P_{n\_elem}$, the number of primitive elements of S connecting to P, at block 1606. The process then loops through each primitive element connecting to P to fill the coupling between P and other terminals of such elements. The k-th primitive element connecting to P in subcircuit S is obtained and denoted as e at block 1608, where it is assumed that P is the p-th terminal of element e.

Once the element e is obtained, the coupling from each terminal of e to node P may be loaded. Since it is likely that some terminals of e may be a port node instead of an internal node of S, the coupling from such port nodes is excluded in the following process. A terminal counter q is initialized to zero at block 1610. It is then determined whether q is less than $e_{n\_term}$, the number of terminals in element e, at block 1612. If q is less than $e_{n\_term}$, the q-th terminal of element e is obtained and denoted as node Q at block 1616. Otherwise, if q is not less than $e_{n\_term}$, then the current element e has been processed and the value of k is incremented at block 1614 to process the next element connected to P. At block 1618, it is determined whether node Q is a subcircuit node of S. If the node Q is not a subcircuit node of S, node Q is skipped and the process branches to block 1624 to increment the value of q and process the next terminal of e. If Q is a subcircuit node of S where Q is the m-th subcircuit node of S, the couplings e(q,p) and e(p,q) are added to the m-th entries of the column vector y and the row vector z, respectively, as shown at block 1620. In addition, the value of w is incremented by the value of e(p) at block 1622.

At block 1606, if k is not less than $P_{n\_elem}$, each element connected to P has been processed. Therefore, each coupling through elements connected to P has been filled into the vectors y and z. Similarly each injection current through elements connected to P has also been added to w. The complete coupling, through instances and elements connected to P, is then obtained at block 1626 by concatenating $x_c$ and $x_d$, obtained at blocks 1532 and 1534, with y and z, respectively, to form new vectors of $x_c$ and $x_d$. The value of $x_r$ is also incremented by the value of w. Since node P is the i-th port of subcircuit S, vectors $x_c$ and $x_d$ will be the i-th column and i-th row of the port coupling matrices $C_P$ and $D_P$, respectively. The value $x_r$ will become the i-th entry value of $i_P$, as shown at block 1628.

Once each coupling to node P, the i-th port of S, has been loaded into port coupling matrices $C_P$ and $D_P$ and each injection current to node P has been added to $i_P$, the process continues at block 1630 to increment the port counter i. At block 1632, the process returns to block 1519 of FIG. 15 to process the remaining port nodes of S.

As described above with reference to FIG. 8, once the matrix equations are loaded, they may be solved hierarchically as shown at block 722. According to one embodiment, the hierarchical matrix solver, in solving each subcircuit S with a dynamic voltage state, includes three phases. Phase 1 performs a depth-first matrix solution for each child instance of the current subcircuit S. In this phase, the internal node voltages of the subcircuit are solved with each port node of the subcircuit instance being held constant at its present voltage state. Once the internal nodes in each child instance of S are solved, the Second phase solves the subcircuit node voltages of S. In this phase, the couplings and injection currents from internal nodes of child instances of S are loaded into matrix equations of subcircuit nodes in S. As described above, the couplings and injection currents may be obtained from the corresponding device model calculations. Once the subcircuit node voltages of S are solved, the internal node voltages of child instances of S are solved again in Phase 3 using the new subcircuit node voltages obtained in Phase 2.

One method of solving the matrix equations as shown at block 722 of FIG. 8 is presented in FIG. 17. During Phase 1, the internal node voltages of child instances are solved at block 1724. Phase 2, during which subcircuit node voltages are solved, is performed at block 1732. In Phase 3, the internal node voltages of each child instance are re-calculated at block 1740. An exemplary hierarchical matrix equation is shown at block 1700 as described above where index m specifies the number of child subcircuit instances in the subcircuit X. The process begins at block 1702 and at block 1704, it is determined whether the number of child instances in the circuit, m, is zero. If the number of instances m is zero, the equation $v_C = G^{-1} i_C$ is solved at block 1706 and the process ends at block 1708. Otherwise, the process continues at block 1710 where the matrix E and the vector f are initialized to G and $i_C$, respectively. An instance counter i may then be initialized to zero at block 1712. If the instance counter i is determined at block 1714 to be less than m, the number of child instances in the subcircuit $X_1$ the process continues at block 1716 where the ith child instance $X_i$ is obtained and $S_i$ refers to the corresponding subcircuit definition. The state associated with $X_i$ is then obtained at block 1718. By way of example, the state may be obtained through the use of a pointer to the set of states associated with the corresponding subcircuit definition $S_i$. If it is determined at block 1720 that the matrix equation with respect to this obtained state has been solved, $v_i$ is set to be the solution with respect to the obtained state at block 1722. However, if the matrix equation has not been solved with respect to the obtained state, the equation $v_i = A_i^{-1} i_{bi}$ is solved recursively at block 1724 using the hierarchical solver presented in FIG. 17. The solution $v_i$ with respect to the obtained state is then stored at block 1726.

Once the solution $v_1$ is obtained, the matrix E and the vector f are updated for the ith child subcircuit instance at block 1728. As shown, the matrix E and the vector f are updated by $E = E - D_i A_i^{-1} i_{ci}$ and $f = f - D_i v_i$. The instance counter i is then incremented at block 1730 and the process continues at block 1714 for the remaining instances. If it is determined at block 1714 that the instance counter i is not less than m, the number of child instances of X, $v_i$ has been solved for each ith child instance and corresponding state. In addition, E and f have been updated for all child instances. Thus, at block 1732, $v_C = E^{-1} f$ is solved. A second instance counter k is then initialized at block 1734. If at block 1736 the second instance counter k is not less than the number of child instances m in the circuit X, the process ends at block 1738. Otherwise, the solution of the k-th child instance that includes the coupling effect from subcircuit nodes $v_c$ of its parent, $v_k = v_{k-A k-1} C_k v_C$, is solved at block 1740. The second instance counter k is incremented at block 1742 and the process continues at block 1736 for the remaining instances.

In this manner, the present invention provides a mechanism for solving a circuit, described by a hierarchical netlist, by recursively solving each subcircuit instance. Accordingly, a hierarchical netlist for any circuit may be solved without flattening the hierarchical netlist.

The present invention may generally be implemented on any suitable computer system. The computer system may include any number of processors that may be coupled to memory devices such as a read only memory (ROM) or a random access memory (RAM). In addition, it is contemplated that such a computer system might be connected to a network to receive information from the network or output information to the network.

The invention can also be embodied as computer readable code on a computer readable medium. The computer readable medium is any data storage device that can store data which can thereafter be read by a computer system. Examples of the computer readable medium include read-only memory, random-access memory, CD-ROMs, magnetic tape, and optical data storage devices. The computer readable medium can also be distributed over a network between coupled computer systems so that the computer readable code is stored and executed in a distributed fashion.

Although illustrative embodiments and applications of this invention are shown and described herein, many variations and modifications are possible which remain within the concept, scope, and spirit of the invention, and these variations would become clear to those of ordinary skill in the art after perusal of this application. For instance, the present invention is described as simulating the electrical characteristics of a circuit using specific block matrices. However, it should be understood that the invention is not limited to circuit simulation using block matrices of this type, but instead would equally apply regardless of the matrices or equations used. Accordingly, the present embodiments are to be considered as illustrative and not restrictive, and the invention is not to be limited to the details given herein, but may be modified within the scope and equivalents of the appended claims.

What is claimed is:

1. A method of simulating the electrical behavior of a circuit using a hierarchical data structure representing the circuit, the method comprising:

starting at a top level in the hierarchical data structure, a current level in the hierarchical data structure being the top level;

identifying a node at the current level in the hierarchical data structure, the node being associated with a subcircuit;

determining a subcircuit definition associated with the node;

associating a one of a plurality of dynamic voltage states for the node from a set of states associated with the subcircuit definition, at least one of the plurality of dynamic voltage states being shared by at least two subcircuit definitions;

ascertaining whether a device model calculation exists for the subcircuit definition at the associated dynamic voltage state; and if it is ascertained that a device model calculation does not exist for the subcircuit definition at the associated dynamic voltage state, moving down a level in the hierarchical data structure and repeating the steps of identifying, determining, associating, ascertaining, and moving until it is ascertained that the device model calculation for the subcircuit definition exists or the identified node is a leaf node.

2. The method as recited in claim 1, further including:

calculating a device model for primitive elements of the subcircuit definition at the associated dynamic voltage state when the identified node is a leaf node.

3. The method as recited in claim 2, further including:

storing the calculated device model such that the calculated device model is associated with the subcircuit definition and the dynamic voltage state in the set of states.

4. A method of modeling a circuit comprising:

generating from a circuit netlist a hierarchical data structure, the hierarchical data structure including a plurality of subcircuit definitions for each of a plurality of subcircuits included in the circuit netlist, at least one of the subcircuit definitions being shared by at least two of the subcircuits, the hierarchical data structure including a plurality of dynamic voltage states corresponding to each of the subcircuits, at least one of the dynamic voltage states being shared by at least two of the subcircuits.

5. The method of claim 4, further comprises:

associating a primitive circuit element for at least one of the plurality of subcircuits with an element definition, the element definition specifying a parameter associated with the primitive element.

6. The method of claim 5, wherein the primitive element includes at least one of a resistor, a capacitor, and a transistor, and the parameter includes at least one of resistance, capacitance, transistor size, and associated device model.

7. The method of claim 4, further comprises:

associating a block matrix equation for at least one of the plurality of subcircuit definitions, the block matrix equation having a plurality of block matrix entries.

8. The method of claim 7, wherein, during simulation, at least one of the plurality of block matrix entries is determined based upon an associated dynamic voltage state.

9. The method of claim 7, wherein, during simulation, at least one of the plurality of block matrix entries is determined based upon at least one of a set of circuit parameters associated with the subcircuit definition.

10. The method of claim 9, wherein the set of circuit parameters includes an admittance, a voltage, a current, and an admittance coupling.

11. The method of claim 5, further comprises:

associating a device model value with at least one of the dynamic voltage states, wherein the device model value is determinable based upon the element definition.

12. The method of claim 11, wherein the primitive element includes at least one of a resistor, a capacitor, and a transistor, and the parameter includes at least one of resistance, capacitance, transistor size, and associated device model.

13. The method of claim 4, wherein the hierarchical data structure includes coupling parameters that specify coupling between the circuit and child subcircuits of the circuit, the method further comprises:

determining whether to set the coupling parameters to zero; and modifying the hierarchical data structure when it is determined that a number of nodes in the circuit exceeds a maximum number of nodes.

14. The method of claim 13, wherein determining whether to set the coupling parameters to zero comprises:

performing equivalent impedance partitioning on the hierarchical data structure.

15. The method of claim 13, wherein modifying the hierarchical data structure is performed when a number of nodes in the circuit is greater than a specified number.

16. The method of claim 13, wherein the coupling parameters specify coupling between subcircuit nodes of the circuit and internal nodes of each child subcircuit of the circuit.

17. The method of claim 14, wherein performing equivalent impedance partitioning comprises:

selecting one of the child subcircuits of the circuit from the hierarchical data structure;

obtaining boundary element values of boundary elements of the selected one of the child subcircuits;

estimating a coupling strength between boundary nodes using the obtained boundary element values; and ignoring selected ones of the coupling parameters when the estimated coupling strength is less than a coupling threshold.

18. The method of claim 13, wherein modifying the hierarchical data structure comprises:

selecting a minimum number of nodes to move outside the circuit in order to partition the circuit; and restructuring the hierarchical data structure to store the partitioned circuit.

19. The method of claim 18, wherein selecting a minimum number of nodes includes:

applying a Min-Cut algorithm to the circuit to select the minimum number of nodes.

20. The method of claim 4, wherein the hierarchical data structure and an associated matrix equation including coupling parameters that specify coupling between the circuit and child subcircuits of the circuit, the method further comprises:

determining with reference to at least one criterion whether to ignore the coupling between the circuit and one or more of the child subcircuits of the circuit;

removing selected ones of the coupling parameters from the matrix equation when it is determined to ignore the coupling between the circuit and one or more of the child subcircuits of the circuit; and restructuring the hierarchical data structure when a number of entries in the associated matrix equation exceeds a size limit.

21. The method of claim 20, wherein the coupling parameters specify coupling between subcircuit nodes of the circuit and internal nodes of child subcircuits of the circuit.

22. The method of claim 20, wherein determining whether to ignore the coupling is performed without flattening all of the hierarchical data structure.

23. The method of claim 20, wherein determining comprises:

examining circuit parameters associated with primitive elements of the circuit to determine whether to ignore the coupling parameters, wherein the circuit parameters include at least one of resistance, capacitance, transistor size, frequency of operation, and device model.

24. The method of claim 4, wherein the hierarchical data structure includes a plurality of circuit nodes, each of the plurality of circuit nodes identifying a subcircuit and corresponding to a subcircuit definition, the method further comprises:

selecting one of the plurality of circuit nodes in the hierarchical netlist; and identifying a subcircuit definition and a dynamic voltage state corresponding to the selected one of the plurality of circuit nodes.

25. The method of claim 24, wherein for each simulation time step t, the method further comprises:

updating each of the dynamic voltage states associated with each of the circuit nodes in the hierarchical data structure;

calculating a device model only once for each set of the subcircuits sharing a same subcircuit definition and a same dynamic voltage state;

generating a matrix equation only once for each set of the subcircuits sharing the same subcircuit definition and the same dynamic voltage state; and wherein, for each set of the subcircuits sharing the same subcircuit definition and the same dynamic voltage state at the time t, solving the corresponding matrix equation only once.

26. A method of simulating a circuit, comprising:

obtaining from a circuit netlist a hierarchical data structure, the netlist including information corresponding to a plurality of subcircuits included in the circuit, the hierarchical data structure including a plurality of subcircuit definitions for each of a plurality of subcircuits included in the circuit netlist, at least one of the subcircuit definitions being shared by at least two of the subcircuits, the hierarchical data structure including a plurality of dynamic voltage states corresponding to each of the subcircuits, at least one of the dynamic voltage states being shared by at least two of the subcircuits;

wherein for each simulation time step t, the method further comprises:

calculating a device model only once for each set of the subcircuits sharing a same subcircuit definition and a same dynamic voltage state.

27. The method of claim 26, wherein for each simulation time step t, the method further comprises:

generating a matrix equation only once for each set of the subcircuits sharing the same subcircuit definition and the same dynamic voltage state;

wherein, for each set of the subcircuits sharing the same subcircuit definition and the same dynamic voltage state at the time t, solving the corresponding matrix equation only once.

28. The method of claim 26, further comprising:

initializing each of the dynamic voltage states to a beginning value before a first simulation time step t; and updating the dynamic voltage states associated with each of the plurality of subcircuits at the time t.

29. The method of claim 28, further comprises:

determining whether total simulation time is greater than a specified total simulation time; and if it is determined that total simulation time is not greater than the specified total simulation time updating the dynamic voltage states associated with each of the plurality of subsets of subcircuits.

30. The method of claim 26, further comprising:

determining the rate of change of a node voltage during a simulation time t; and varying a value of a subsequent simulation time step t based upon the determined rate of change in the node voltage.

31. The method of claim 28, wherein updating the dynamic voltage states associated with each of the plurality of subcircuits at the simulation time t further comprises:

selecting one of the plurality of subcircuits;

determining voltages at nodes in the selected one of the plurality of subcircuits from the associated subcircuit definition; and modifying the dynamic voltage states associated with the one of the plurality of subcircuits to include the determined voltages.

32. The method of claim 28, wherein updating the dynamic voltage states comprises:

selecting one of the plurality of subcircuits;

determining voltages at nodes in the selected one of the plurality of subcircuits from the associated subcircuit definition; and maintaining the dynamic voltage state of the selected one of the plurality of subcircuits in the dynamic voltage states associated with the one of the plurality of subcircuits.

33. The method of claim 32, wherein maintaining comprises:

linking the dynamic voltage state to the dynamic voltage states associated with the one of the plurality of subcircuits.

34. The method of claim 26, wherein calculating a device model only once for each set of the subcircuits sharing a same subcircuit definition and a same dynamic voltage state, comprises:

storing the calculated device model; and linking the calculated device model to the same subcircuit definition and the same dynamic voltage state.

35. The method of claim 27, wherein calculating comprises:

calculating a device model for primitive elements in the same subcircuit definition.

36. The method of claim 27, wherein generating a matrix equation comprises:

selecting one of the plurality of subcircuits in the hierarchical data structure;

identifying a subcircuit definition corresponding to the selected one of the plurality of subcircuits;

loading a matrix equation with device model values associated with the identified subcircuit definition and the associated dynamic voltage state at the present simulation time t.

37. The method of claim 36, further comprising:

determining whether the matrix equation associated with the selected subcircuit definition has been solved at a dynamic voltage state associated with the selected subcircuit definition; and if it is determined that the matrix equation has not been solved, solving the matrix equation for voltages at nodes in the associated subcircuit by applying the dynamic voltage state associated with the selected subcircuit definition.

38. The method of claim 37, further comprising:

linking the solution to the matrix equation at the identified voltage state to the set of dynamic voltage states associated with the identified subcircuit definition.

39. An article comprising a storage medium having stored thereon instructions that when executed by a machine result in operations comprising:

generate from a netlist a hierarchical data structure representing a circuit, the hierarchical data structure including a plurality of subcircuit definitions for each of a plurality of subcircuits included in the circuit netlist, at least one of the subcircuit definitions being shared by at least two of the subcircuits, the hierarchical data structure including a plurality of dynamic voltage states corresponding to each of the subcircuits, at least one of the dynamic voltage states being shared by at least two of the subcircuits.

40. The article of claim 39, further comprises instructions that when executed by the machine results in the following:

associate a primitive circuit element for at least one of the plurality of subcircuits with an element definition, the element definition specifying a parameter associated with the primitive element.

41. The article of claim 40, wherein the primitive element includes at least one of a resistor, a capacitor, and a transistor, and the parameter includes at least one of resistance, capacitance, transistor size, and associated device model.

42. The article of claim 39, further comprises instructions that when executed by the machine results in the following:

associate a block matrix equation for at least one of the plurality of subcircuit definitions, the block matrix equation having a plurality of block matrix entries, at least one of the plurality of block matrix entry values based upon an associated dynamic voltage state.

43. The article of claim 42, wherein, at least one of the plurality of block matrix entry values based upon at least one of a set of circuit parameters associated with the subcircuit definition.

44. The article of claim 43, wherein the set of circuit parameters includes an admittance, a voltage, a current, and an admittance coupling.

45. The article of claim 40, further comprises instructions that when executed by the machine results in the following:

associate a device model value with at least one of the dynamic voltage states, wherein the device model value is determinable based upon the element definition.

46. The article of claim 45, wherein the primitive element includes at least one of a resistor, a capacitor, and a transistor, and the parameter includes at least one of resistance, capacitance, transistor size, and associated device model.

47. The article of claim 39, wherein the hierarchical data structure includes coupling parameters that specify coupling between the circuit and child subcircuits of the circuit, the article further comprises instructions that when executed by the machine results in the following:

determine whether to set the coupling parameters to zero; and modify the hierarchical data structure when it is determined that a number of nodes in the circuit exceeds a maximum number of nodes.

48. The article of claim 47, wherein determining whether to set the coupling parameters to zero comprises:

perform equivalent impedance partitioning on the hierarchical data structure.

49. The article of claim 47, wherein modifying the hierarchical data structure is performed when a number of nodes in the circuit is greater than a specified number.

50. The article of claim 47, wherein the coupling parameters specify coupling between subcircuit nodes of the circuit and internal nodes of each child subcircuit of the circuit.

* * * * *